United States Patent
Takagi et al.

[19]

[11] Patent Number: 6,130,458
[45] Date of Patent: Oct. 10, 2000

[54] POWER IC HAVING SOI STRUCTURE

[75] Inventors: Yosuke Takagi; Koichi Endo, both of Tokyo, Japan

[73] Assignee: Kabushiki Kaisha Toshiba, Kawasaki, Japan

[21] Appl. No.: 08/828,028

[22] Filed: Mar. 27, 1997

[30] Foreign Application Priority Data

Mar. 28, 1996 [JP] Japan .................................. 8-074225

[51] Int. Cl.$^7$ ............................. H01L 27/01; H01L 29/76
[52] U.S. Cl. ...................... 257/351; 257/347; 257/350; 257/349; 257/341
[58] Field of Search .................... 257/139, 341, 257/347, 350, 351, 352, 354

[56] References Cited

U.S. PATENT DOCUMENTS

| | | | |
|---|---|---|---|
| 5,113,236 | 5/1992 | Arnold et al. | 257/347 |
| 5,200,638 | 4/1993 | Kida et al. | 257/368 |
| 5,359,219 | 10/1994 | Hwang | 257/350 |
| 5,525,824 | 6/1996 | Himi et al. | 257/374 |
| 5,610,426 | 3/1997 | Asai et al. | 257/355 |
| 5,736,435 | 4/1998 | Venkatesan et al. | 438/151 |
| 5,801,089 | 9/1998 | Kenney | 438/589 |
| 5,828,101 | 10/1998 | Endo | 257/330 |
| 5,917,222 | 6/1999 | Smaling et al. | 257/370 |

FOREIGN PATENT DOCUMENTS 7-211911   8/1995   Japan .

Primary Examiner—Tom Thomas
Assistant Examiner—Ori Nadav
Attorney, Agent, or Firm—Oblon, Spivak, McClelland, Maier & Neustadt, P.C.

[57] ABSTRACT

The present invention relates in general to power ICs, etc. having the SOI structure, and more specifically to the structure in which an SOI substrate comprises a base substrate, an SOI oxide film formed on the base substrate, and active layers formed on the SOI oxide film, and also integrates on itself power devices and the corresponding control elements monolithically. Between this base substrate and this SOI oxide film is formed heavily-doped semiconductor regions having a conductivity type opposite to that of this base substrate. Hence, the junction capacitance between the base substrate and the heavily-doped semiconductor regions decreases an actual capacitance between the base substrate and the active layer so that to inhibit or prevent inversion layers from being formed at the bottom of the active layers.

16 Claims, 18 Drawing Sheets

INVERSION LAYER 19

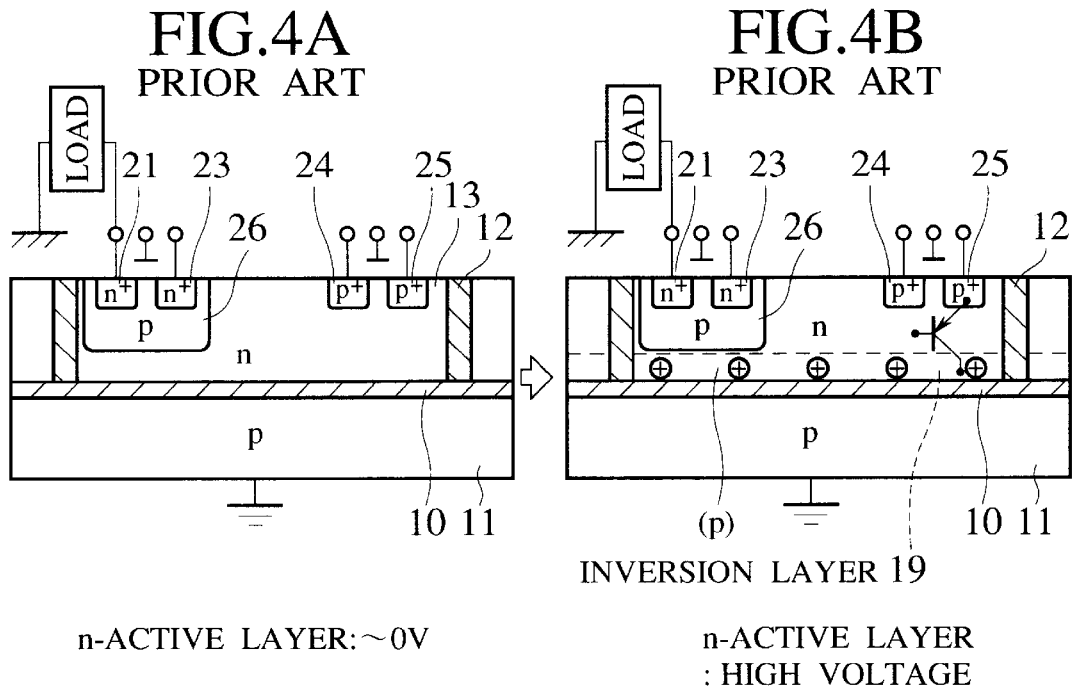
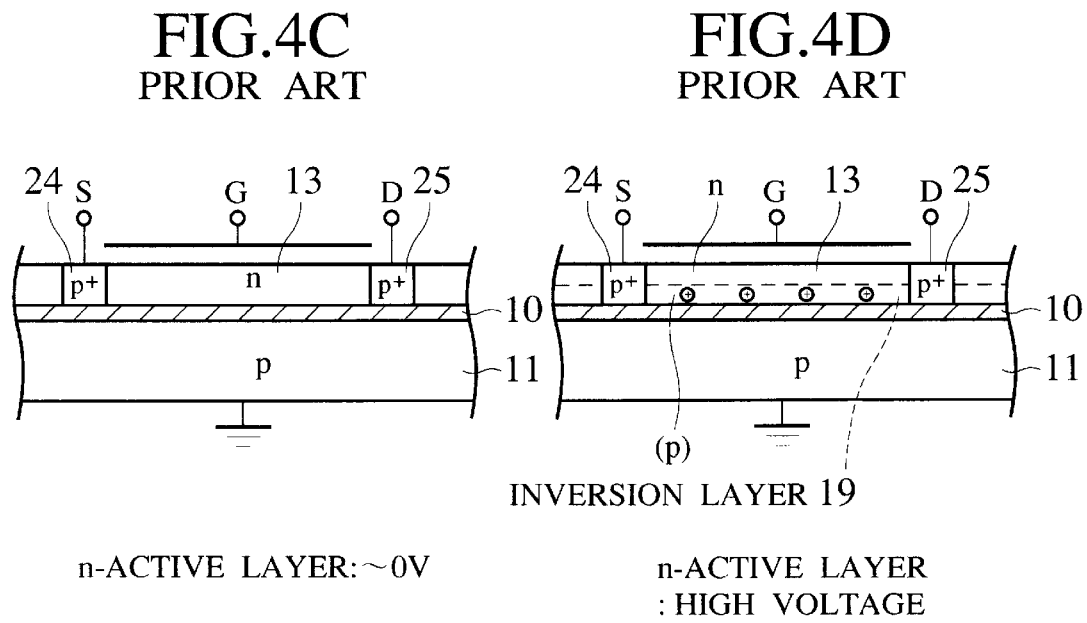

DEPLETION LAYER 29

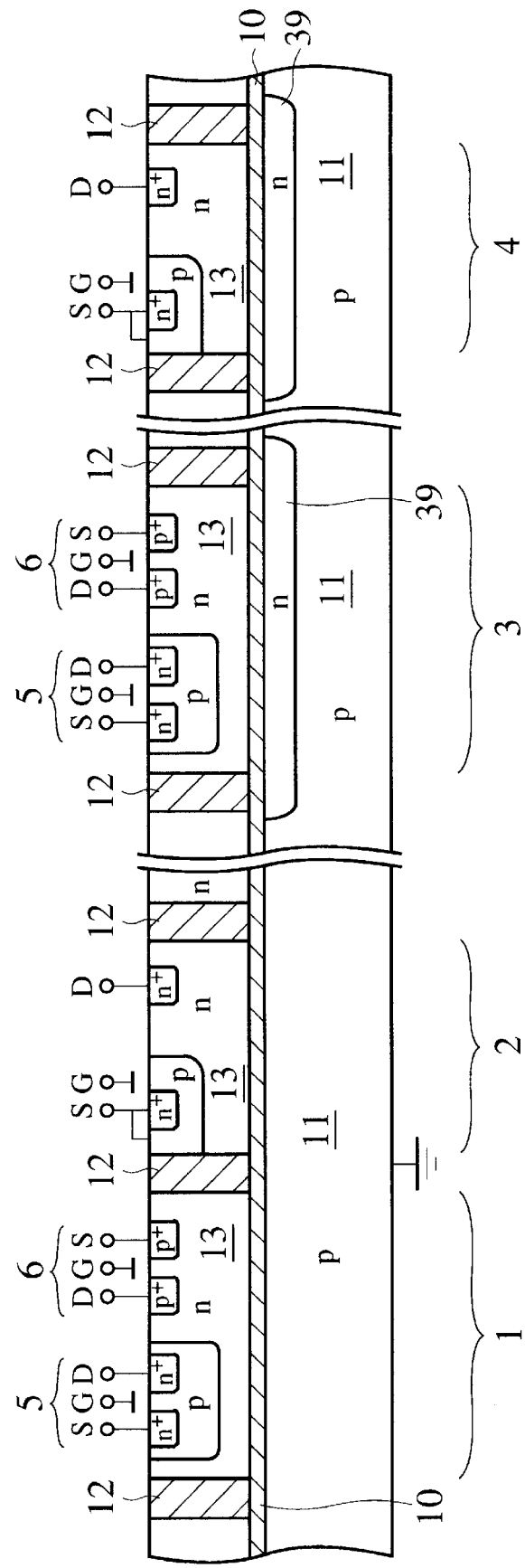

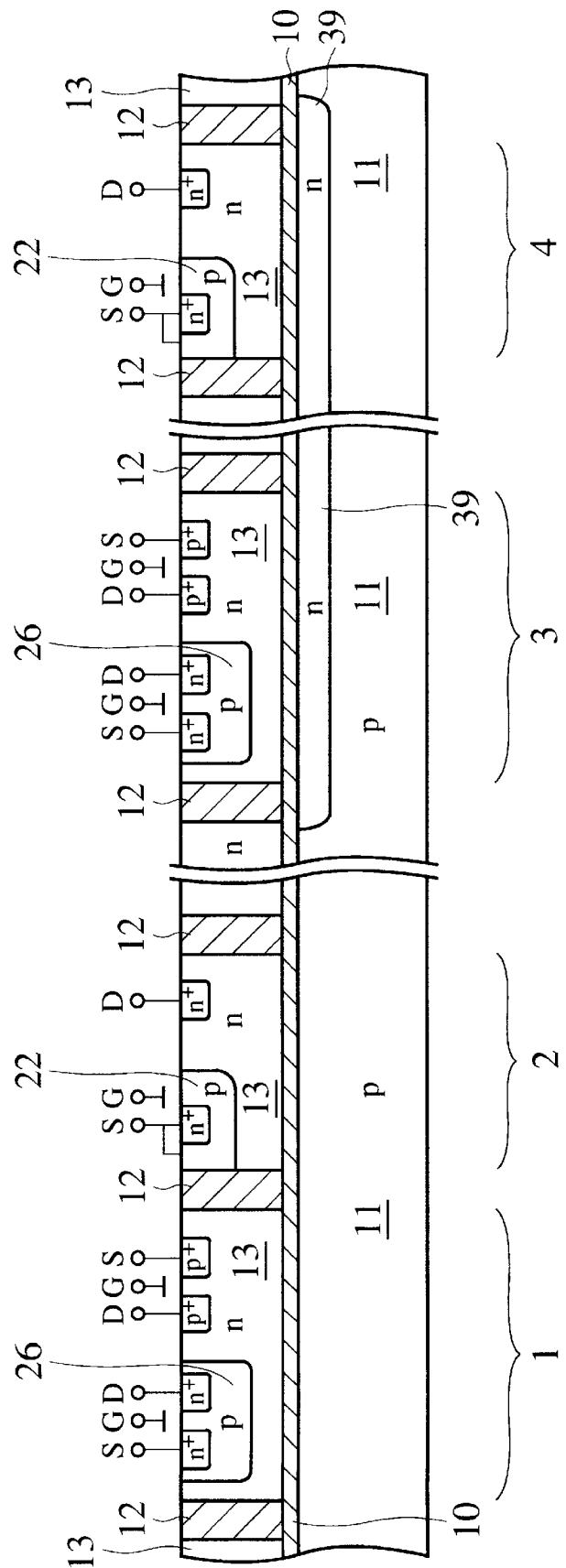

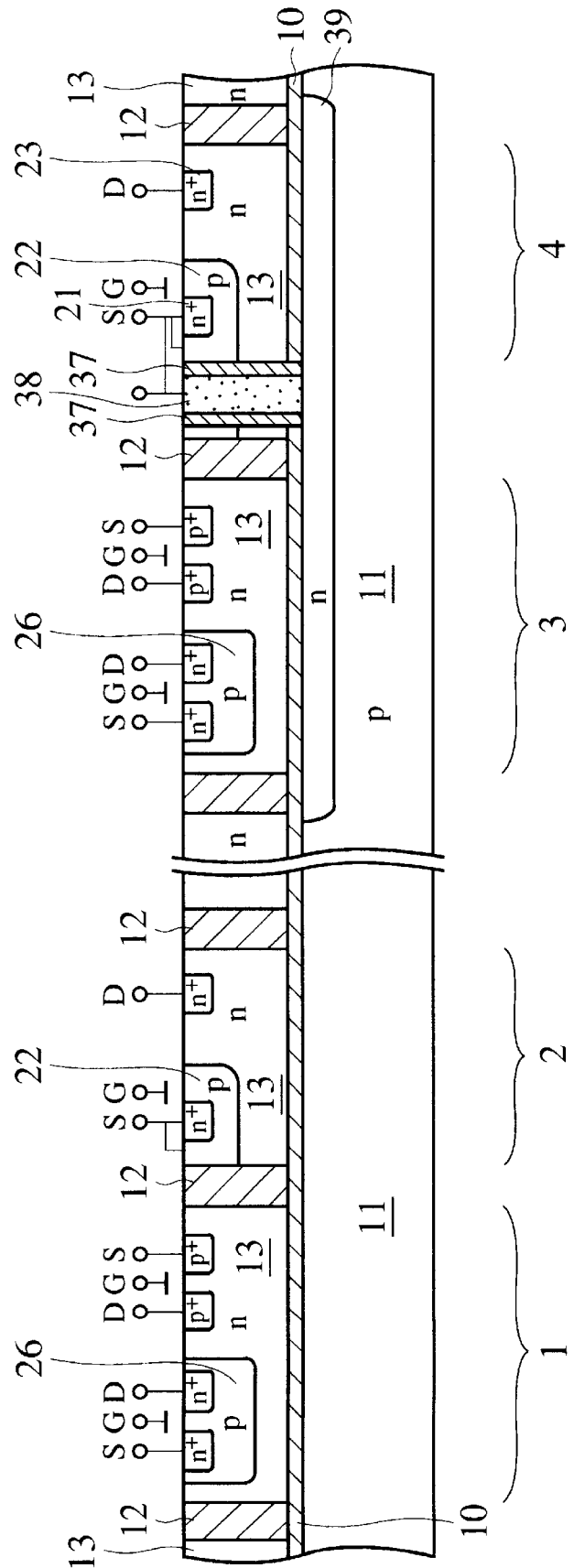

POWER IC HAVING SOI STRUCTURE

BACKGROUND OF THE INVENTION

1. Field of the Invention

The present invention relates in general to a semiconductor device having the Silicon On Insulator (SOI) structure, and more particularly to a power IC monolithically integrating in it high blocking voltage power elements and control circuits and also to a hybrid IC or an intelligent power module in which high breakdown voltage power element chips and control-circuit chip are mounted on a prescribed substrate.

2. Description of the Prior Art

Recently, the developments of the power ICs have been activated. In the field of the insulation/isolation technology, the dielectric isolation (DI) technique has been developed in a multifarious manner as well as the brushing up of the direct wafer bonding technique and the SOI technique, while the dielectric insulation structure which fits larger power handling capability applications has been improved. In the field of the device design technology, on the other hand, constant advances have been made in the realization of higher-performance composite devices incorporating bipolar transistors and MOS transistors and also multi-functional devices including high-accuracy analog CMOS transistors. Also, even higher levels of intelligent devices in which various types of circuits are integrated have been further advancing, while the level-shift circuit technology has been actively developed to eliminate potential differences between the low-voltage control circuitry and the high-voltage output circuitry. Moreover, development examples of various types of power ICs utilizing all of those techniques have been reported, accelerating their practical applications.

In each of the power IC chips are merged many elements having different performances and structures desired. In their manufacturing, therefore, the technique of isolating those elements adjacent each other is fundamental. One of those inter-element isolation techniques is known as the DI technique shown in FIGS. 1A and 1B. The DI technique generally employs such a structure that the top surface of the SOI substrate is partially trenched by means of etching and, then, inside thus formed trenches are filled dielectrics 12. The DI technique decreases the inter-element parasitic effects at the same time as increasing the dielectric breakdown voltage, thus expecting future application as an inter-element isolation technique in an even wide variety of fields. FIG. 2 is a cross-sectional view of the power IC referred to as an intelligent power device in which a lateral power MOSFETs and control circuits, here CMOS control circuits, are monolithically integrated in an SOI substrate (wafer) structure. In the power IC shown in FIG. 2, a plurality of islands, each of them is called an active layer 13, are divided and isolated by using the DI technique and formed on an SOI oxide film 10. The p-type silicon substrate, which acts as a base substrate (supporting substrate) 11 in the SOI structure, is generally connected to the ground (GND potential) fixedly.

In such a structure as shown in FIG. 2, n-type active-layer islands 13 isolated from each other by dielectrics 12 are biased to various potential levels, one of which may produce inversion layer at the bottom of the active layers 13, i.e. at the boundary between an SOI oxide film 10 and the active layers 13, depending on the relationship between the base substrate 11 and the island 13, giving rise to some serious problems depending on the operational condition of the elements.

FIGS. 3A and 3B show the schematic diagram of two examples of such problems; the former indicates a case where an n-channel LDMOS transistor (Lateral Double-Diffused MOSFET) is turned on as a low-side switch and the latter, a case where an n-channel LDMOS is turned on as a high-side switch. In FIG. 3A, an $n^+$-type source region 21 of the LDMOS transistor is connected to the ground (GND potential), while in FIG. 3B, LDMOS's $n^+$-type drain region 23 is connected to the high-voltage power supply and, at the same time, $n^+$-type source region 21 is grounded via a load, so that the n-type active layer 13 is in the floating status. Here the load of the high-side switch may be an active element or circuitry such as the low-side switch.

In the case where, as shown in FIG. 3B, the LDMOS transistor is used as a high-side switch, the effective thickness $X_2$ of the drift region formed in the n-type active layer 13 becomes thinner because an inversion layer 19 is formed, increasing the forward voltage drop (on-state voltage drop) $V_F$. For the low-side switch, the effective thickness of the drift region is $X_1$, almost the same as the thickness of the n-type active layer 13, whereas for the high-side switch, that effective thickness is $X_2$, smaller than $X_1$. This effect is remarkable especially where the n-type active layer 13 is thin.

FIGS. 4A through 4D show another example of the problem that an inversion layer 19 occurs at the boundary between an SOI oxide film 10 and an n-type active layer 13 in a power IC which comprises an Insulated Gate Bipolar Transistor (IGBT) or other output elements used as a high-side switch and a high-side CMOS control circuit which controls this output element. As shown in the cross-sectional view in FIG. 4A, the high-side CMOS control circuit consists of an n-MOS unit transistor having an $n^+$-type source region 21 and an $n^+$-type drain region 23 and a p-MOS unit transistor having a $p^+$-type source region 25 and a $p^+$-type drain region 24. The high-side CMOS control circuit, which controls an output device used as a high-side switch, would operate generally with the output device IGBT's emitter region (or power MOSFET's source region) and the n-MOS transistor's $n^+$-type source region 21 being connected to a common potential. Namely, the reference potential at the n-MOS transistor's $n^+$-type source region 21 of the CMOS transistor is a floating potential dictated by an operation condition. Because the potential of the n-type active layer 13 having the high-side CMOS control circuit becomes higher when the output device is ON, a p-type inversion layer 19 is generated at the bottom. Therefore, as shown in FIG. 4B, a parasitic pnp-type bipolar transistor occurs between the p-MOS transistor's $p^+$-type source region 25 and the p-type inversion layer 19, easily giving rise to a latchup phenomenon as compared to the case where that output device is OFF. Moreover, as shown in FIGS. 4C and 4D, when the active layer becomes even thinner, specifically 0.5 micrometer to 1.0 micrometer approximately, both the p-MOS transistor's $p^+$-type source region 25 and $p^+$-type drain region 24 reach an oxide layer 10 at the bottom, so that when the p-type inversion layer 19 is formed, a leakage current flows between the $p^+$-ype drain and source regions 24 and 25.

To solve such troubles, there are available the following:

(1) A method (first method) of changing the potential of the base substrate 11 by equalizing it to the potential of the source (or emitter) of an output device used as a high-side switch; and (2) another method (second method) of making the SOI structure's oxide film 10 very thick to decrease the parallel-plate MOS capacitance so that no inversion layer is formed easily.

Generally, however, the number of output devices used as high-side switches is not always limited to one and also each of them would operate independently. In contrast, the base substrate 11 would generally operate as the common region staying at a same potential in the structure, so that the first method is often impossible and, even if possible, it has a problem that the structure becomes complicated. The second method, on the other hand, is difficult in practice to carry out because it is necessary to make the oxide layer 10 thick enough to decrease the MOS capacitance considerably and, even if carried out, it suffers from expensive manufacturing costs.

SUMMARY OF THE INVENTION

In consideration of solving those problems, it is therefore an object of the present invention to provide the novel structure of power ICs monolithically integrating many elements such as output ones and the corresponding control circuits in an SOI structure, which prevents an inversion layer from being formed at the boundary between active layers and SOI oxide films, the inversion layer is responsible for the generation of the leakage currents and the deterioration of various electrical characteristics.

Another object of the present invention is to provide the structure of power device including hybrid ICs and intelligent power modules mounting high blocking voltage power element chips and control circuit chips on a prescribed substrate, which prevents the malfunctioning due to a latchup phenomenon or a leakage current which may occur in those control circuit chips under high voltage conditions.

A further object of the present invention is to realize high-reliability, high-voltage, and large-current operations of the power ICs comprising high-side circuits and low-side circuits, by preventing a latchup phenomenon and also by inhibiting leakage current occurrence in the control circuit chips used to control the high-side circuit's output elements.

To achieve the above-mentioned objects, the present invention features such a power IC or the like semiconductor device which basically has an SOI structure comprising at least a first semiconductor region which acts as the base substrate (or the supporting substrate), an SOI oxide film or the like insulator film formed on the first semiconductor region, and a second semiconductor region which acts as an active layer formed on this insulator film, in which, in the vicinity of the boundary between the first semiconductor region and the insulator film and also in at least some of the top surfaces of the first semiconductor regions, a third semiconductor region having a conductivity type opposite to that of the first semiconductor region is formed. If, for example, the base substrate is of p-type silicon substrate, the third semiconductor region must be an n-type diffused layer or n-type epitaxial layer.

The present invention features such a respect that, preferably, a groove (trench) starting from the top surface of the second semiconductor region which acts as an active layer would be formed in such a way as to penetrate through the second semiconductor region and the insulator region (SOI oxide film, etc.) and reach the third semiconductor region and that a high-conductivity region is formed in the groove. As this high-conductivity region may be desired a refractory metal or other metal layer, metal silicide layer, polycide layer, impurity-doped polycrystalline silicon layer, etc. Also, an insulator film may be formed inside the groove which is located at the boundary between the high-conductivity region and the second semiconductor layer, i.e. active layer, as occasion demands.

More preferably, in and a part of the top surfaces of the second semiconductor regions (active layers) would be formed a fourth semiconductor layer, which would in turn be connected to the high-conductivity region with a prescribed surface wiring such as an Al layer, Al-Si layer, impurity-doped polycrystalline silicon layer, or other known surface interconnection materials. As the fourth semiconductor region is desirable one of the two main electrodes of the power device which acts as an output device. For example, an $n^+$-type source region of the output DMOS transistor or $n^+$-type emitter region of the output IGBT may be the fourth semiconductor region.

In a structure according to the present invention, the conductivity type of the first semiconductor region which acts as the base substrate and that of the second semiconductor region which acts as an active layer should preferably be opposite to each other. If, for example, the first semiconductor region is p-type, the second semiconductor region should preferably be n-type in conduction type. Another preferable embodiment is such that the first and second semiconductor regions would be of the same conductivity type. For example, both the first and second semiconductor regions are n-type or p-type in conductivity type.

Also, in a power IC according to the present invention, element-isolating regions starting from the surface of the second semiconductor region are formed in such a way as to penetrate through this second semiconductor region and reach the insulator film, so that this second semiconductor region is divided into a plurality of active regions, i.e., active layers. The element-isolating region may be the one formed with the DI technique which utilizes a dielectric material. Alternatively, a well-known Junction Isolation (JI) technique may be used, in which diffused regions (high-impurity concentration regions) may be used for this purpose which have a conductivity type opposite to that of the second semiconductor region. If, for example, the second semiconductor region is an n-type active region (n-type active layer), a p-type diffused layer may be formed as against this n-type active region, by using the JI technique. The third semiconductor should preferably be provided just under a whole bottom surface of prescribed active layer.

In a structure according to the present invention, as shown in FIG. 5A, capacitance $C_{OX}$ due to the insulator film 10 such as an SOI oxide film is connected in series to junction capacitance $C_J$ developed between a third semiconductor region 39 and a first semiconductor region 11. That is, the actual capacitance C created between the second semiconductor region 13 and the first semiconductor region 11 is:

$$1/C = 1/C_{OX} + 1/C_J \tag{1}$$

In general, $C_J$ can be made much smaller than $C_{OX}$ due to the large depletion layer width. As can be seen from Equation (1), since capacitance C is small as compared to that of a prior-art structure shown in FIG. 5B, an inversion layer 19 such as shown in FIGS. 3B, 4B, and 4D is hard to develop, or it may be inhibited or prohibited.

Also, if a fourth semiconductor region in an active layer, for example, an $n^+$-type source region of an output DMOS transistor, is electrically connected with the third semiconductor region through the high-conductivity region so that this $n^+$-type source region and this third region may be of the same potential, the inversion layer 19 cannot possibly be formed in an area as long as the blocking voltage $V_{DS}$ applied to that output DMOS transistor is relatively low. And the actual capacitance C becomes smaller as the depletion layer width develops with a larger voltage $V_{DS}$. Hence the inversion layer is prohibited to generate even at a higher blocking voltage of output of output DMOS transistor.

The present invention prevents the development of an inversion layer at the bottom of the active layer, which would otherwise occur because of a problematical potential relationship between the base substrate and the active layer in the conventional SOI structure. Hence, it is possible to prevent the on-state voltage drop of the power IC's output elements from increasing and leakage currents from flowing in the control circuits, or the device from malfunctioning.

The present invention covers not only the above-mentioned power ICs but also so-called hybrid ICs having high breakdown voltage power element chips and control circuit chips mounted on a predetermined substrate such as an insulation substrate and also the equivalent power devices. By employing the above-mentioned SOI structure having the third semiconductor region for the control circuit chips which make up the hybrid IC, it is possible to prevent an inversion layer from being formed at the bottom of the active layers having the control circuits. And it is also possible to prevent the generation of leakage currents in and malfunctioning of those circuits. In power devices such as hybrid ICs having high-side and low-side switches, the high-side control circuit is made to be in the floating state and a high potential with respect to the base substrate is applied to the active layer, in which the high-side control circuit is realized. In a structure according to the present invention, because the capacitance between this active layer and this base substrate becomes smaller, the occurrence of the charge which is responsible for the formation of inversion layers is inhibited. The above-mentioned "the equivalent power devices" would be meant to cover a higher hierarchy of assembling, such as an integrated power device mounted on PC boards or other mother boards. The equivalent power devices may include the intelligent power module. The high breakdown voltage power device may be a power module, etc. in which a plurality of identical power elements are interconnected.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employment of the invention in practice.

BRIEF DESCRIPTION OF THE DRAWINGS

FIGS. 4A and 4B are cross-sectional views describing high-side CMOS control circuits formed in conventional SOI structure in the case where active layers are relatively thick and FIGS. 4C and 4D, the p-MOS transistors in the case where active layers are relatively thin;

FIG. 6B is a schematic cross-sectional view of a power IC related to the first embodiment of the present invention;

FIG. 7 is a schematic cross-sectional view of a power IC related to the second embodiment of the present invention;

FIG. 8 is a schematic cross-sectional view of a power IC related to the third embodiment of the present invention;

DETAILED DESCRIPTION OF THE EMBODIMENTS

Figure 1A:
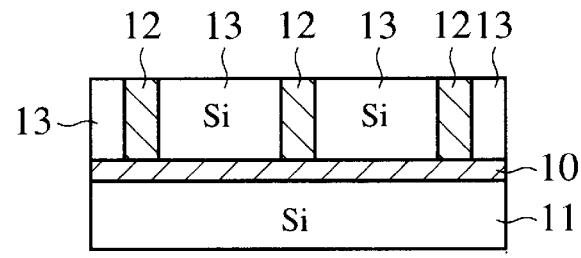
FIG. 1A is a cross-sectional view illustrating an SOI structure utilizing the conventional trench isolation method and FIG. 1B, a cross-sectional view illustrating the conventional V-shaped trench isolation structure.
Figure 1B:
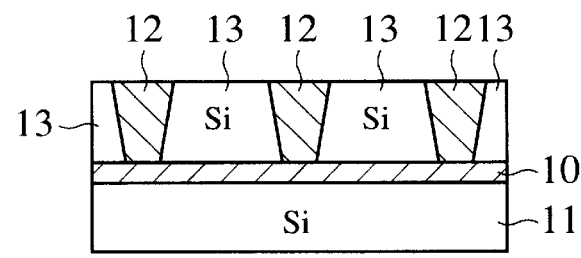
Figure 2:
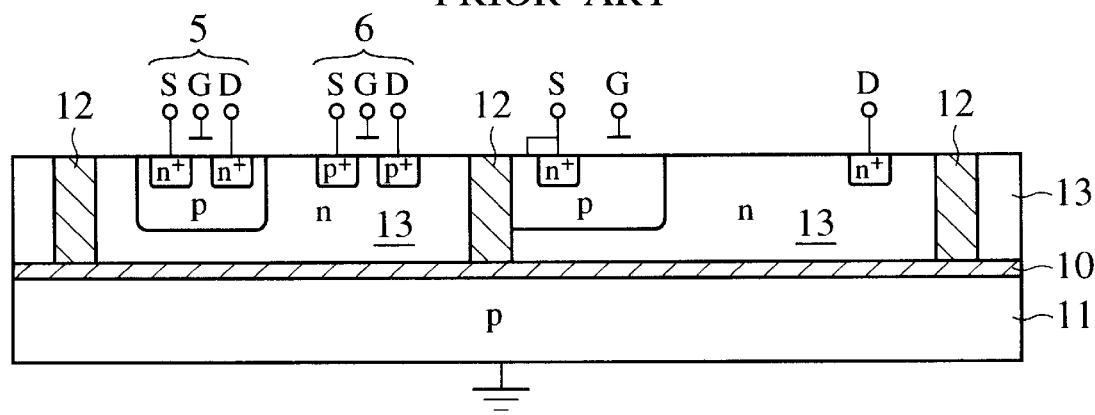
FIG. 2 is a cross-sectional view illustrating an example of power ICs utilizing the conventional SOI structure.

Various embodiments of the present invention will be described with reference to the accompanying drawings. It is to be noted that the same or similar reference numerals are applied to the same or similar parts and elements throughout the drawings, and the description of the same or similar parts and elements will be omitted. Generally and as it is conventional in the representation of semiconductor devices, it will be appreciated that the various drawings are not drawn to scale from one figure to another nor inside a given figure, and in particular that the layer thickness are arbitrarily drawn for facilitating the reading of the drawings.

First Embodiment

Figure 6A:
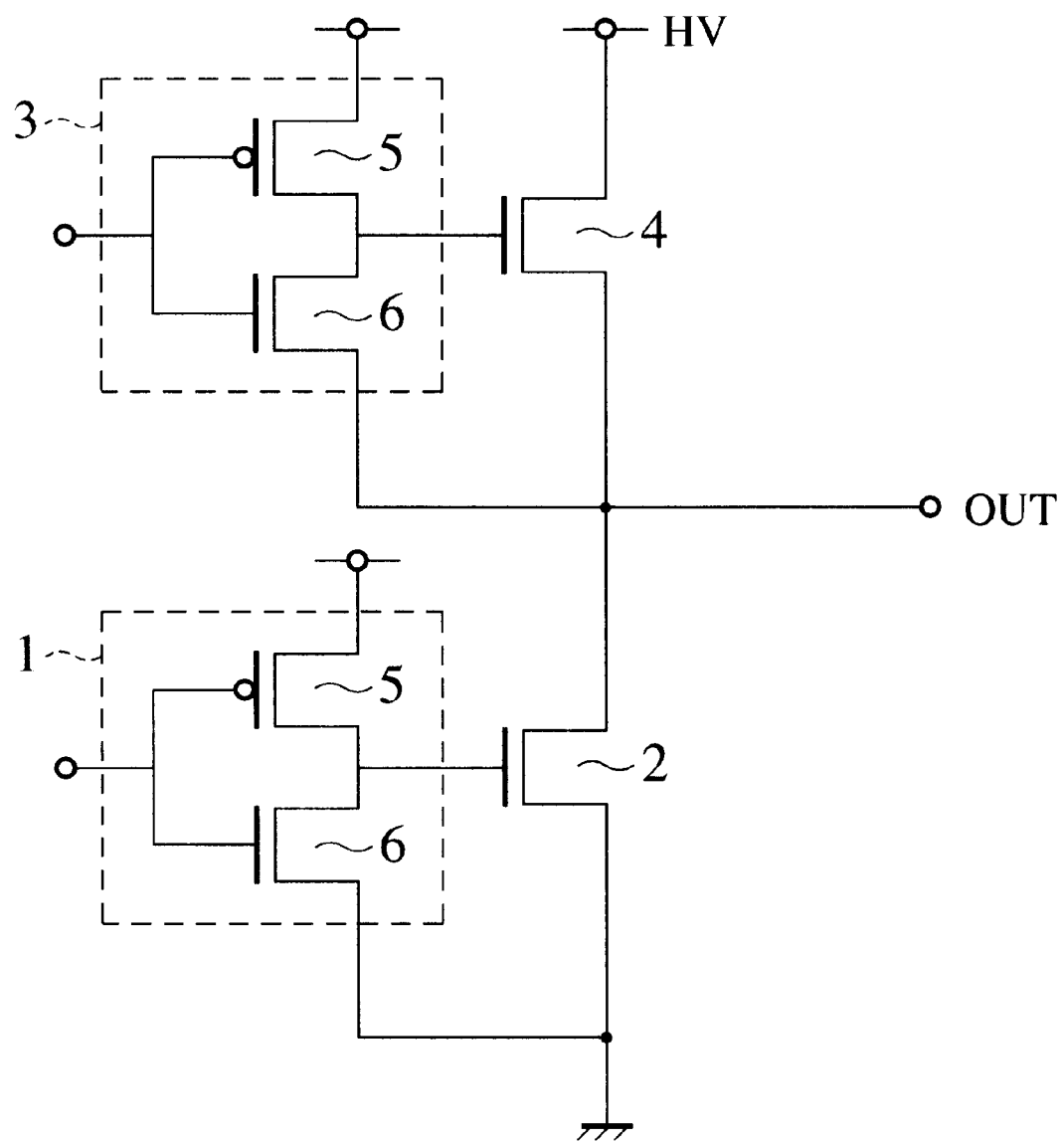
FIG. 6A is a diagram of the equivalent circuit of a power IC related to the first embodiment of the present invention.

FIG. 6A is a diagram of the equivalent circuit of a power IC related to the first embodiment of the present invention. In the first embodiment of the present invention, a high-side output DMOS transistor 4 is connected in series with a low-side output DMOS transistor 2 and the connection between them acts as the output terminal. The high-side and low-side output DMOS transistors 4, 2 are high-blocking voltage power elements. To the gate of the high-side output DMOS transistor 4 is connected a high-side control circuit 3 and to the gate of the low-side output DMOS transistor 2, a low-side control circuit 1. Each of the high-side and low-side control circuits 3 and 1 is a CMOS circuit consisting of a p-MOS unit transistor 5 and an n-MOS unit transistor 6. The source electrode of the high-side control circuit 3's n-MOS transistor 6 is directly connected with the source electrode of the high-side output DMOS transistor to provide a common potential. By making the high-side control circuit 3 a floating state as a whole, it can be avoided to apply excessive voltage to the p-MOS transistor 5 and the n-MOS transistor 6 having low breakdown voltages. The drain electrode of the high-side output DMOS transistor is connected to the power supply (HV) having prescribed high voltage of 250V to 1700V. The source electrode of the low-side output DMOS transistor is connected to the ground line. In the first embodiment of the present invention, the above-mentioned high-side output DMOS transistor 4, low-side output DMOS transistor 2, high-side control circuit 3, and low-side control circuit 1 are integrated on the same semiconductor chip. Moreover, it is of course possible to integrate also protection circuits, current detection circuits, and small-signal circuits on the same semiconductor chip. The small-signal circuits supply input signals to these high-side and low-side control circuits 3 and 1.

Figure 3A:
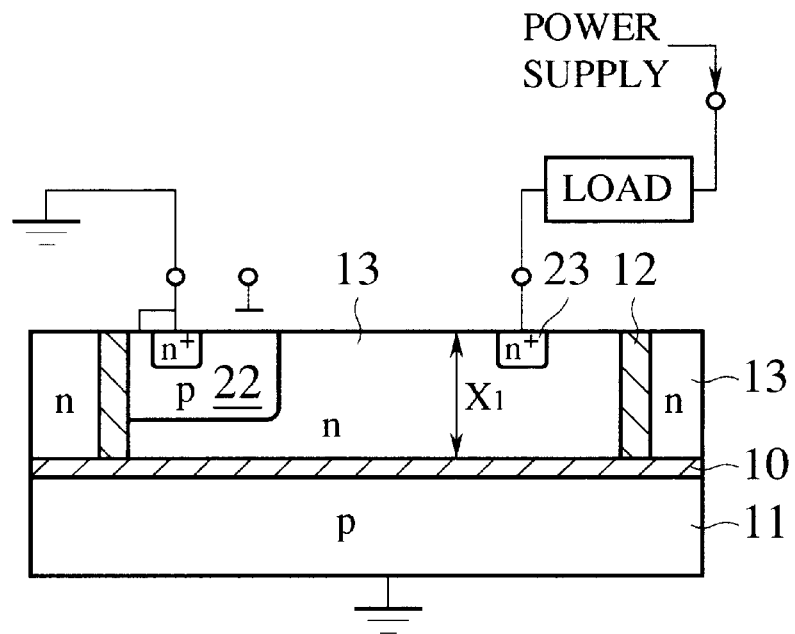
FIGS. 3A and 3B are cross-sectional views describing a low-side and a high-side switches formed in conventional SOI structures, respectively.
Figure 3B:
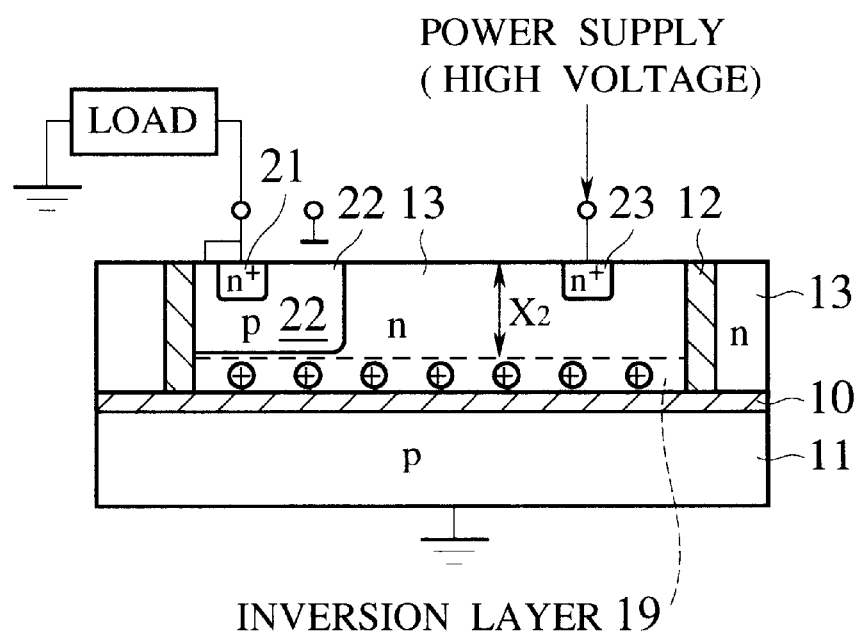
Figure 5A:
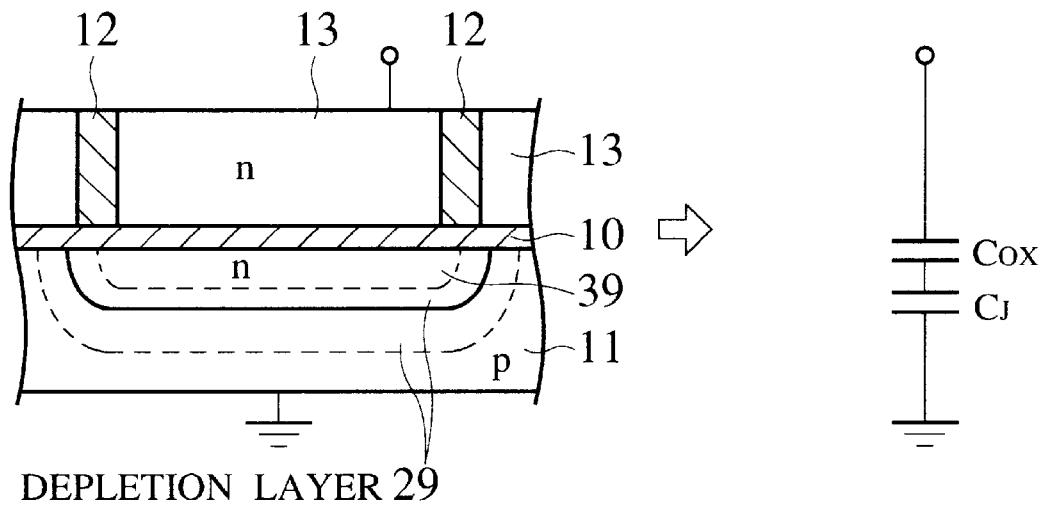
FIG. 5A is a cross-sectional view and a diagram of the equivalent circuit describing the principles of the present invention and FIG. 5B, a diagram of the equivalent circuit of the conventional SOI structure given for comparison.
Figure 5B:
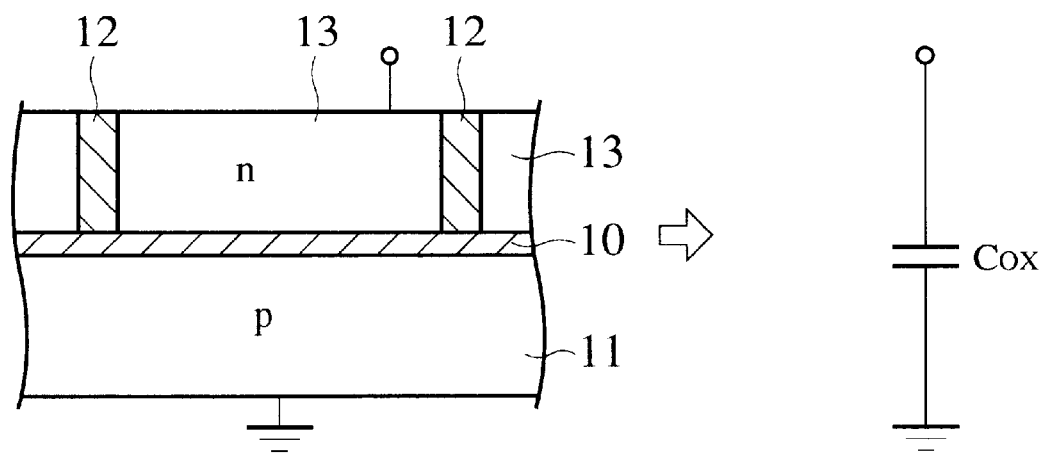

FIG. 6B shows a cross-sectional view of the power IC related to the first embodiment of the present invention. This first embodiment employs such a basic SOI structure that on a base substrate (a supporting substrate) 11 made of p-type silicon as a first semiconductor region is formed an SOI oxide film 10 as an insulator film, on which is formed a second semiconductor region made of n-type silicon. In this SOI structure, element isolation regions 12 are used to isolate and form a plurality of n-type active layers. In those n-type active layers 13 are formed a low-side control circuit 1, a low-side output DMOS transistor 2, high-side control circuit 3, and high-side output DMOS transistor 4. Directly under the SOI oxide film below the active layers 13 having the high-side output DMOS transistor 4 and the high-side control circuit 3 respectively are formed two n-type diffused layers 39, which act as the third semiconductor regions of the present invention, so as to cover the respective whole bottom surface of the active layers 13. The effects due to those n-type diffused layers 39 are evident from FIG. 5A. As described above, FIG. 5A is a schematic cross-sectional view of the structure, according to the present invention, in which under the SOI oxide film 10 which acts as the insulator film, the n-type diffused layer 39 is formed which acts as the third semiconductor region; while FIG. 5B is a schematic cross-sectional view of the conventional SOI structure which does not have the n-type diffused layer 39. In the structure according to the present invention shown in FIG. 5A, the SOI oxide film capacitance $C_{OX}$ is connected in series with the pn-junction capacitance $C_J$, so that the total capacitance C decreases as indicated by Equation (1), inhibiting p-type inversion layers 19 such as shown in FIGS. 3B, 4B, and 4D from being formed at the bottom of the active layers 13. On the top surface of the p-type silicon-made base substrate 11 having an impurity concentration of $5 \times 10^{12}$ cm$^{-3}$ to $1 \times 10^{15}$ cm$^{-3}$ approximately and a thickness of 250 micrometers to 600 micrometers may be formed the n-type diffused layer 39 having an impurity concentration of $5 \times 10^{17}$ cm$^{-3}$ to $1 \times 10^{20}$ cm$^{-3}$ and a diffusion depth of 3 micrometers to 20 micrometers. Selective diffusion method is employed so as to wholly cover the areas corresponding to each entire bottom surface of the active layers having the high-side control circuit 3 and the high-side output DMOS transistor 4. An SOI structure shown in FIG. 6B can be provided by the Silicon-wafer Direct Bonding method (hereinafter called "SDB method"), the Separation by IMplanted OXygen (SIMOX) method, or the epitaxial growth method. The thickness of an SOI oxide film created by the SDB method should preferably be one to three micrometers approximately, which belongs within a standard thickness employed in silicon technology, thus avoiding the generation of cracks in the SOI oxide film.

Second Embodiment

FIG. 7 is a schematic cross-sectional view of the power IC related to the second embodiment of the present invention that has a basic structure in which on a p-type silicon 11 which acts as a first semiconductor region is formed an insulator film (oxide film) 10, on which are formed n-type active layers 13 which act as a second semiconductor region having a thickness of one to five micrometers. In this SOI structure, by dielectrics 12 which act as an element isolation region are isolated a plurality of n-type active layers 13, each of which has a width of 40 to 60 micrometers. In those n-type active layers 13 are formed a low-side control circuit 1, low-side output DMOS transistor 2, high-side control circuit 3, and high-side output DMOS transistor 4. The low-side and high-side output DMOS 2, 4 are high-blocking voltage power elements of the present invention. The thickness of the n-type active layers 13 is not limited to the above-mentioned value of one to five micrometers. A larger value of, for example, 10 micrometers is acceptable, but a smaller thickness of 0.5 to 1.0 micrometer approximately would of course effect the present invention's features better. In contract to the power IC according to the first embodiment of the present invention, in which an n-type diffused layer 39 formed directly under an SOI oxide film 10 is divided and isolated into two regions, each corresponding to a high-side control circuit 3 and a high-side output DMOS transistor 4; the second embodiment of the present invention features a respect that the n-type diffused layer 39 is continuously formed as a common region for the high-side control circuit 3 and the high-side output DMOS transistor 4. The basic SOI structure of a power IC according to the second embodiment of the present invention may be manufactured in such a way that into and at an upper surface of the p-type silicon substrate 11 are first formed n-type diffused layers 39 having an impurity concentration of $5 \times 10^{17}$ to $5 \times 10^{19}$ cm$^{-3}$ approximately, on which is formed the SOI oxide film 10 having a thickness of two to three micrometers, via which the n-type active layers 13 and the p-type silicon (base substrate) 11 are bonded to each other by the SDB method. The mirror like polished bottom surface of the n-type silicon 13 and the mirror surface of the SOI oxide film 10 were mated with facing mirror surface to mirror surface and annealed at 900° C. 1150° C. The SDB method in this case may be of an anode bonding type, by which these substrates are heat-treated while applying a predetermined voltage to themselves. Just under the whole bottom surfaces of the n-type active layers 13 having the high-side control circuit 3 and the high-side output DMOS transistor 4 are continuously formed the n-type diffused layers 39 which act as the third semiconductor region, to increase a mask alignment margin, so that the manufacturing of those devices becomes easy as compared to the first embodiment.

Third Embodiment

FIG. 8 is a schematic cross-sectional view of a power IC according to the third embodiment of the present invention, which has such a basic SOI structure that on a p-type silicon layer 11 which acts as a first semiconductor region is formed an oxide film 10 which acts as an insulator film, on which are formed n-type active layers 13 which act as a second semiconductor region. In this SOI structure, dielectrics 12 are used to isolate the plurality of n-type active layers 13, in which are formed a low-side control circuit 1, a low-side output DMOS transistor 2, a high-side control circuit 3, and a high-side output DMOS transistor 4. In a power IC according to the third embodiment of the present invention, an n-type diffused layer 39, which acts as a third semiconductor region, formed directly under the SOI oxide film 10 is, as in the case of the second embodiment of the present invention, continuously formed as a common region for the high-side control circuit 3 and the high-side output DMOS transistor 4. The common region 39 fully covers the area corresponding to the entire bottom surfaces of active layers having the high-side control circuit 3 and the high-side output DMOS 4, respectively. The third embodiment of the present invention has an $n^+$-type source region 21, which acts as a fourth semiconductor region, in some of the surfaces of the n-type active layers 13. The $n^+$-type source region 21 is one of the two main electrodes of the high-blocking voltage power element, i.e., the output DMOS transistor 4. Also, the n-type diffused layer 39 to prevent an inversion layer from being formed is so electrically connected as to be of the same potential as the $n^+$-type source region 21 of the output DMOS transistor 4 used as a high-side switch. The $n^+$-type source region 21 is formed in a p-type base region 22 given as a fifth semiconductor region. When, in such a structure, the blocking voltage of low-side output DMOS transistor 2 is sufficiently low, an inversion layer 19 can be completely inhibited, so that the third embodiment is even more effective than the first and second embodiments of the present invention. According to the third embodiment of the present invention, to electrically conduct between the n-type diffused layer 39 which acts as the third semiconductor region and the $n^+$-type source region 21 which acts as the fourth semiconductor region, etching is carried out to form a groove which starts at the top surface of the n-type active layer 13 which acts as the second semiconductor region, penetrates through the insulator film (SOI oxide film) 10, and reaches the n-type diffused layer 39 which acts as the third semiconductor region; and into thus formed groove a high-conductivity region 38 is buried. This high-conductivity region 38 may be formed, for example, as follows: First the n-type active layer 13 and the SOI oxide film 10 are etched by the Reactive Ion Etching (RIE) method using $CF_4+O_2$, $SF_6+O_2$, $SF_6+H_2$, $CCl_4$, or $SiCl_4$, the microwave plasma etching method, or the Electron Cyclotron Resonance (ECR) etching method, to provide a trench (groove). Next, at the inside wall of this trench, a side wall oxide film 37 is formed only on the trench's side wall by carrying out directional etching such as low pressure RIE method using $CF_4+H_2$ so that the oxide film 37 at the bottom of the trench is selectively removed. Then, the selective CVD method, etc. is used to bury a refractory metal such as W, Mo, or Ti into the trench to provide the high-conductivity region 38. This high-conductivity region 38 may be a silicide of refractory metals such as $WSi_2$, $MoSi_2$, $TiSi_2$, $CoSi_2$, or $TaSi_2$. Or, the high-conductivity region 38 may be impurity-doped polycrystalline silicon (DOPOS) in which such as phosphorus (P) or arsenic (As) is doped. Also, polycide may be used as this high-conductivity region 38. The high-conductivity region 38 and the $n^+$-type source region 21 can be interconnected with a prescribed surface wiring. "A prescribed surface wiring" means a standard surface interconnection made of DOPOS, Al, Al-Si, or refractory metal and can be easily formed with a known metallization technique.

Fourth Embodiment

Figure 9A:
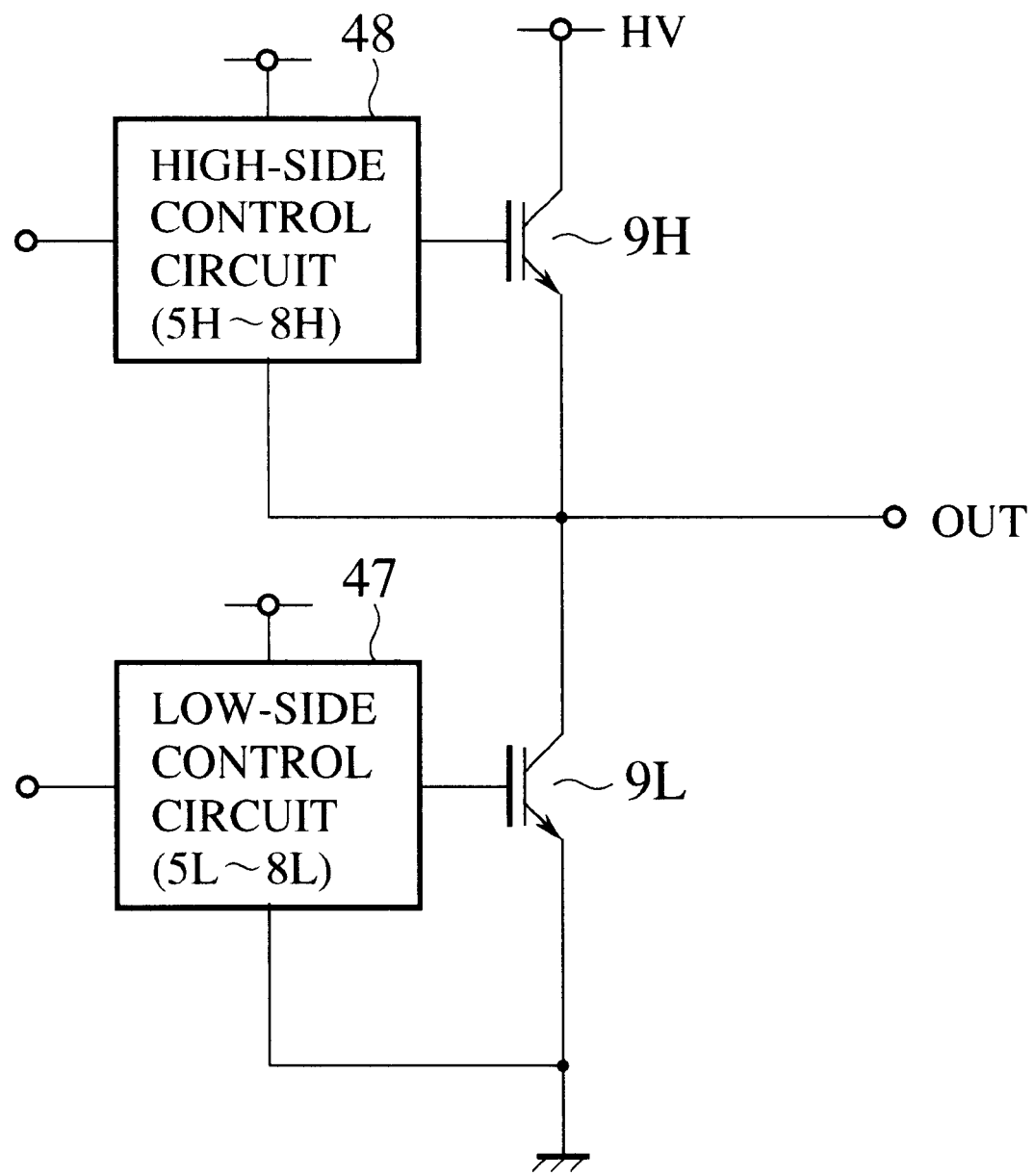
FIG. 9A is a diagram of the equivalent circuit of a power IC related to the fourth embodiment of the present invention.
Figure 9B:
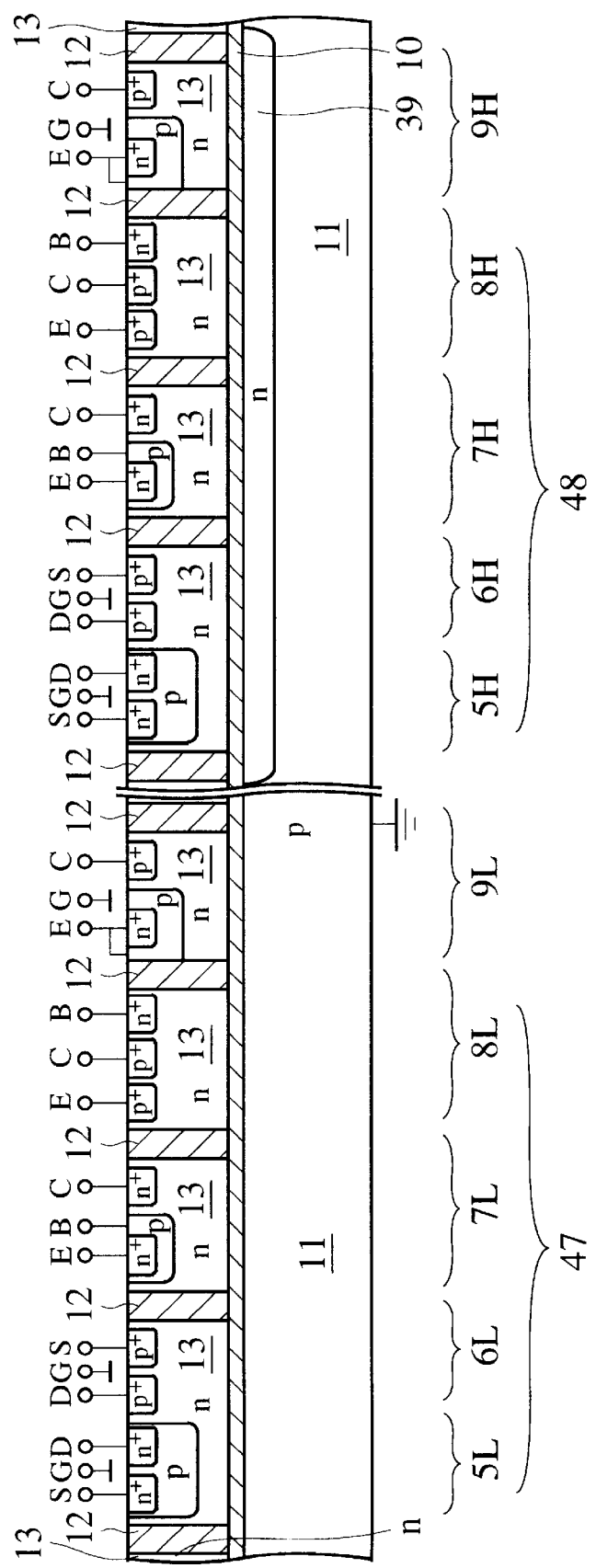
FIG. 9B is a schematic cross-sectional view of a power IC related to the fourth embodiment of the present invention.

Although the first through third embodiments of the present invention have been described with a case where they use an n-channel DMOS transistor as the output element and a CMOS transistor as the control circuit, these are mere examples and the present invention is applicable irrespective of the type of the control device or the type of the power device used as the output device. FIGS. 9A and 9B are, respectively, a diagram of the equivalent circuit of a power IC related to the fourth embodiment of the present invention and a schematic cross-sectional view of the device, in which n-channel IGBTs 9H and 9L are used as the high-blocking voltage power element for the output element, while as the control circuit elements are used CMOS circuit consisting of n-MOS unit transistors 5L and 5H and p-MOS unit transistors 6L and 6H, npn-type bipolar transistor 7L and 7H, and pnp-type bipolar transistors 8L and 8H. FIG. 9B shows a basic SOI structure in which on a p-type silicon-made base substrate 11 which acts as a first semiconductor region is formed an SOI oxide film 10 which acts as an insulator film, on which are formed n-type active layers 13. In this SOI structure, dielectrics 12 are used to isolate the plurality of n-type active layers 13, in which are formed the CMOS circuits, npn-type bipolar transistors 7L and 7H, pnp-type bipolar transistors 8L and 8H, and output n-channel IGBTs 9L and 9H. In FIG. 9B, throughout whole area just under a high-side CMOS circuit consisting of an n-MOS unit transistor 5H and a p-MOS unit transistor 6H, high-side bipolar transistors 7H and 8H, and high-side output n-channel IGBT 9H is formed a continuous n-type diffused layer 39, to inhibit an inversion layer from being formed in each of the high-side n-type active layers 13.

Fifth Embodiment

Figure 10A:
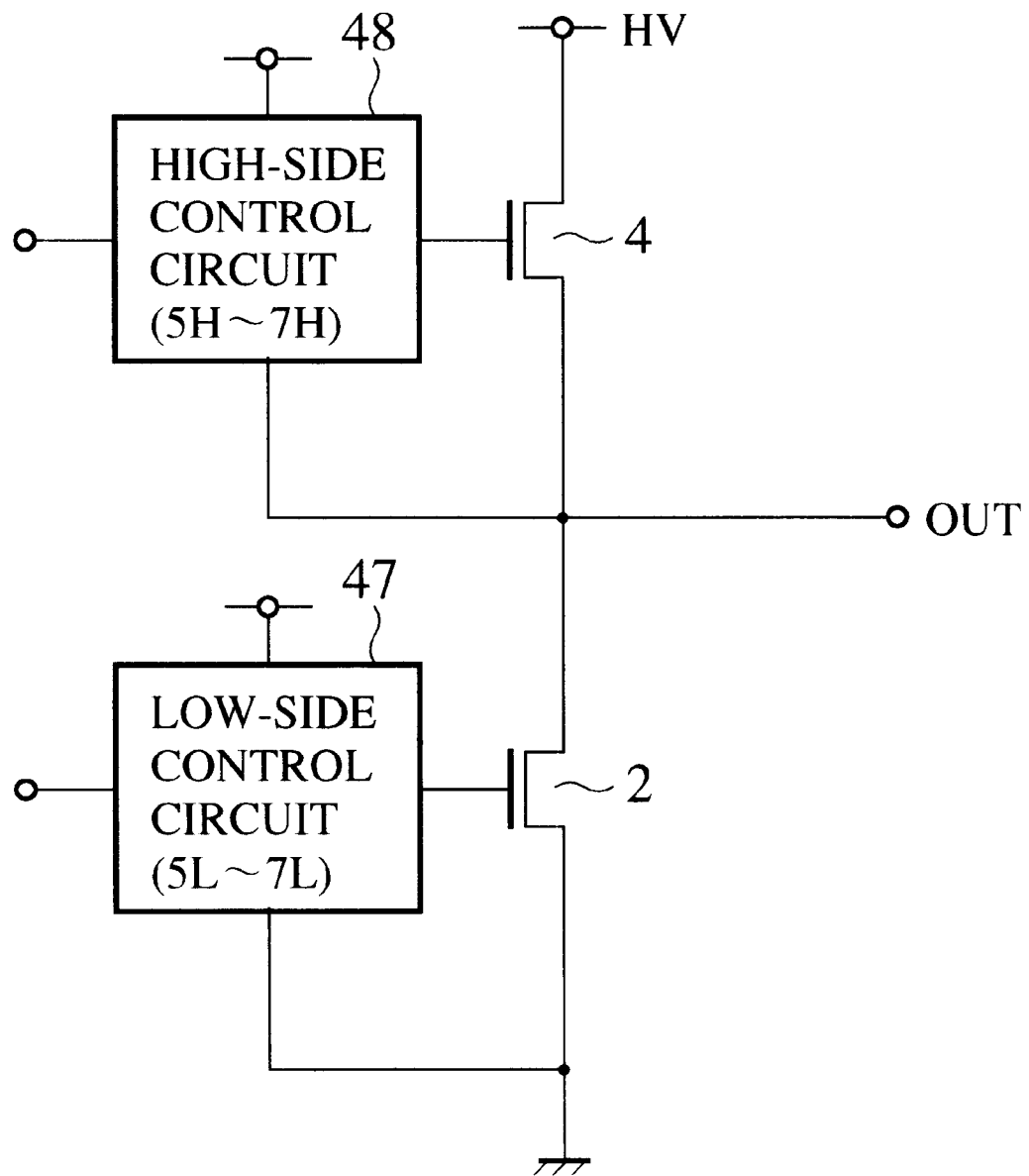
FIG. 10A is a diagram of the equivalent circuit of a power IC related to the fifth embodiment of the present invention.
Figure 10B:
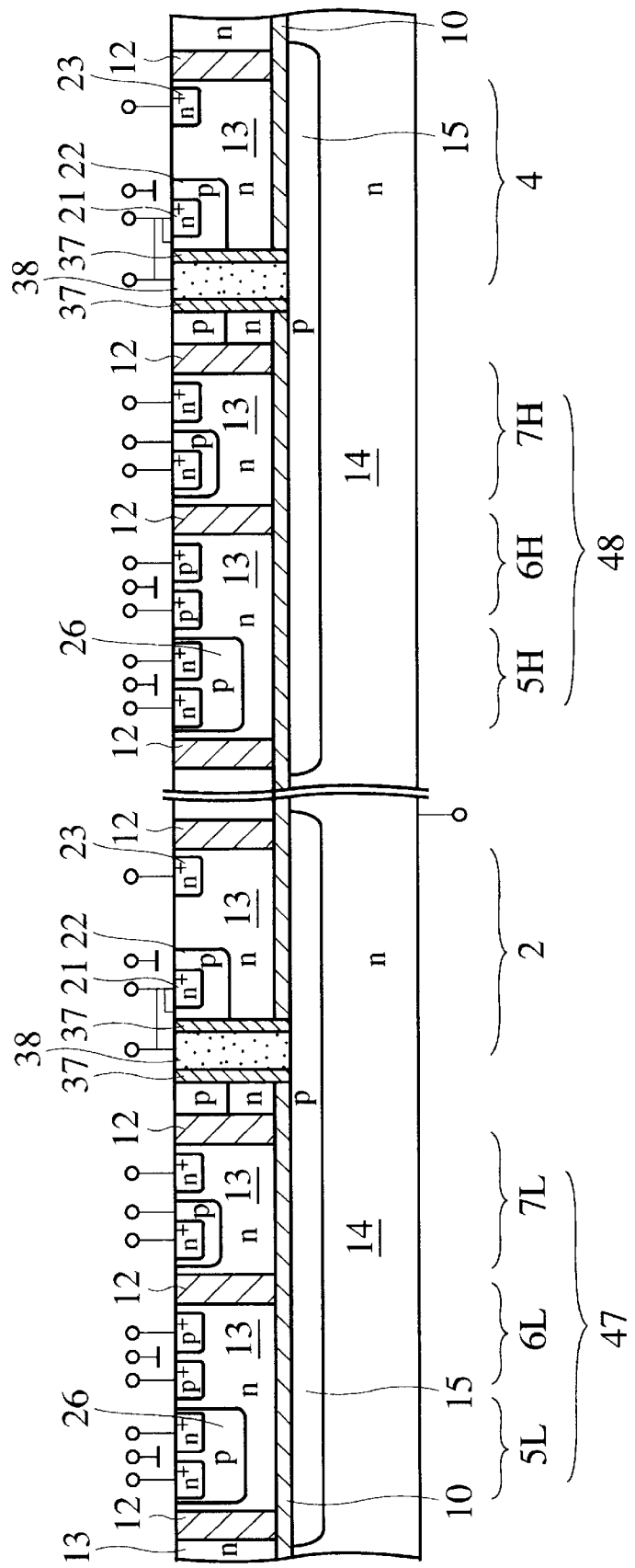
FIG. 10B is a schematic cross-sectional view of a power IC related to the fifth embodiment of the present invention.

FIGS. 10A and 10B are a diagram of the equivalent of a power IC related to the fifth embodiment of the present invention and its schematic cross-sectional view, respectively; and this power IC has a basic SOI structure in which on an n-type silicon-made base substrate 14 is formed an SOI oxide film 10 which acts as an insulator film, on which are formed n-type silicon layers 13 which act as a second semiconductor region. In this SOI structure, the n-type active layers 13 are isolated by dielectrics 12 and formed into a plurality of islands. That is, those active layers (first semiconductor regions) 13 are of the same conductivity type as that of the first semiconductor region. In those n-type active layers 13 are formed a CMOS circuit consisting of n-MOS unit transistors 5L and 5H, p-MOS unit transistors 6L arid 6H, npn-type bipolar transistors 7L and 7H, and output DMOS transistors 2 and 4. When a power IC according to the fifth embodiment of the present invention is used, a highest potential is applied to the n-type silicon substrate 14. Directly under the SOI oxide film 10 are formed two p-type diffused layers 15, which act as third semiconductor regions, as a low-side common region and high-side common region, respectively. Also, at a part of the surface of the specific n-type active layer 13 is formed an $n^+$-type source region 21 as a fourth semiconductor region. The $n^+$-type source region 21 acts as one of the two main electrodes of the output DMOS transistor and is formed in p-base regions 22 which act as a fifth semiconductor region. The $n^+$-type source region 21 is electrically connected via high-conductivity region 38 to one of the p-type diffused layer 15. The p-type diffused layer 15 thus formed makes it difficult for an inversion layer 19 to be formed in the n-type active layers 13, thus preventing the on-state voltage drop (forward voltage drop) of the output DMOS transistor from increasing and also the leakage current from flowing in the CMOS or bipolar transistors.

Sixth Embodiment

Figure 11:
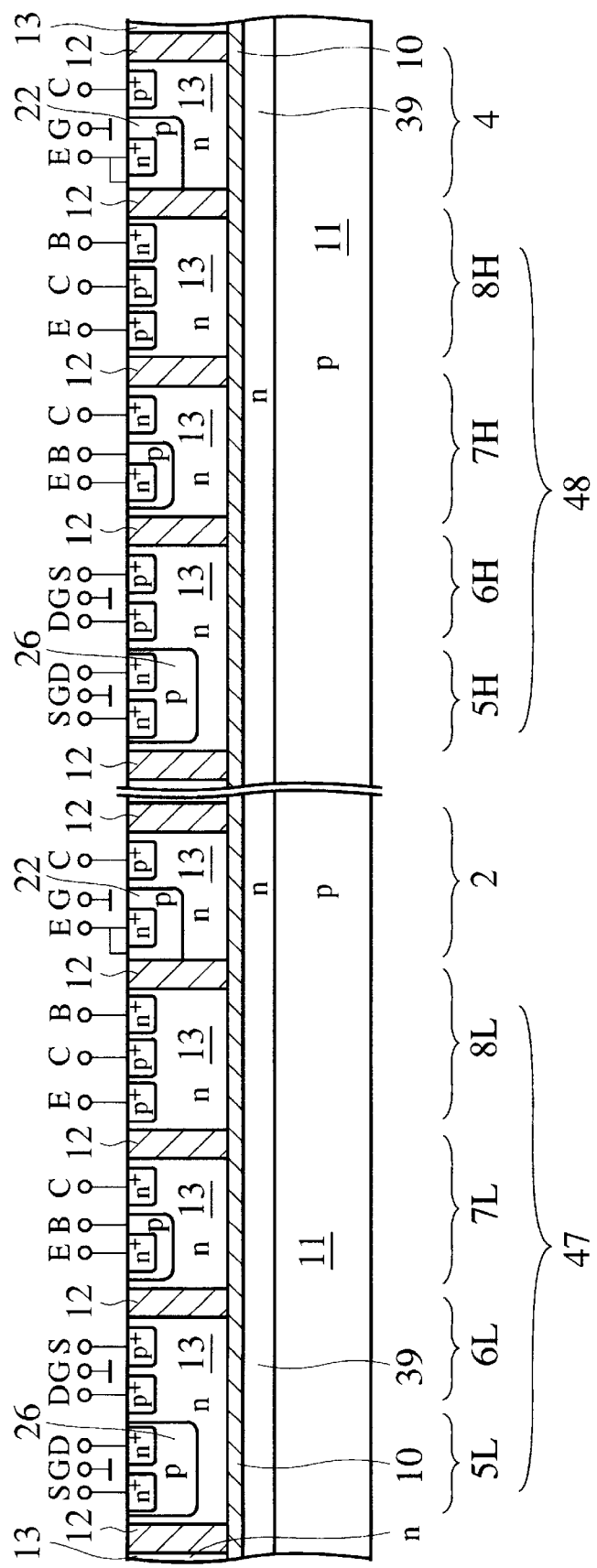
FIG. 11 is a schematic cross-sectional view of a power IC related to the sixth embodiment of the present invention.

FIG. 11 is a schematic cross-sectional view of a power IC related to the sixth embodiment of the present invention, where thoroughly on a p-type silicon-made base substrate 11 which acts as a first semiconductor region is formed an n-type diffused layer 39 which acts as a third semiconductor region. The sixth embodiment of the present invention forms an n-type diffused layer 39, which acts as a third semiconductor region, thoroughly on the substrate, so that there is no need to carry out selective diffusion by use of, for example, photolithography nor to carry out mask alignment with respect to the pattern of n-type diffused layer 39 in the process of manufacturing CMOS or bipolar transistors, thus simplifying the processes as a whole.

In the sixth embodiment of the present invention, throughout on the p-type silicon substrate 11 may be formed the n-type epitaxial layer 39 by, for example, the vapour phase epitaxial growth method employing $SiH_4$, $SiH_2Cl_2$, $SiHCl_3$, $SiCl_4$ with dopant gas such as $PH_3$, $AsH_3$. After epitaxy, the SOI structure is realized by use of the SDB method. As the third semiconductor regions under the high-side and low-side circuits are formed as one body, a relatively large potential difference may be generated between the second and third semiconductor regions depending on operational conditions. Hence, in the sixth embodiment of the present invention, the potential of the n-type diffused layer (or n-type epitaxial layer) 39, should preferably be in the floating state to compensate the relatively large potential difference. For this purpose, the resistivity of this layer 39 should preferably be rather high value of 30 to 100 ohm-cm approximately.

Seventh Embodiment

Figure 12A:
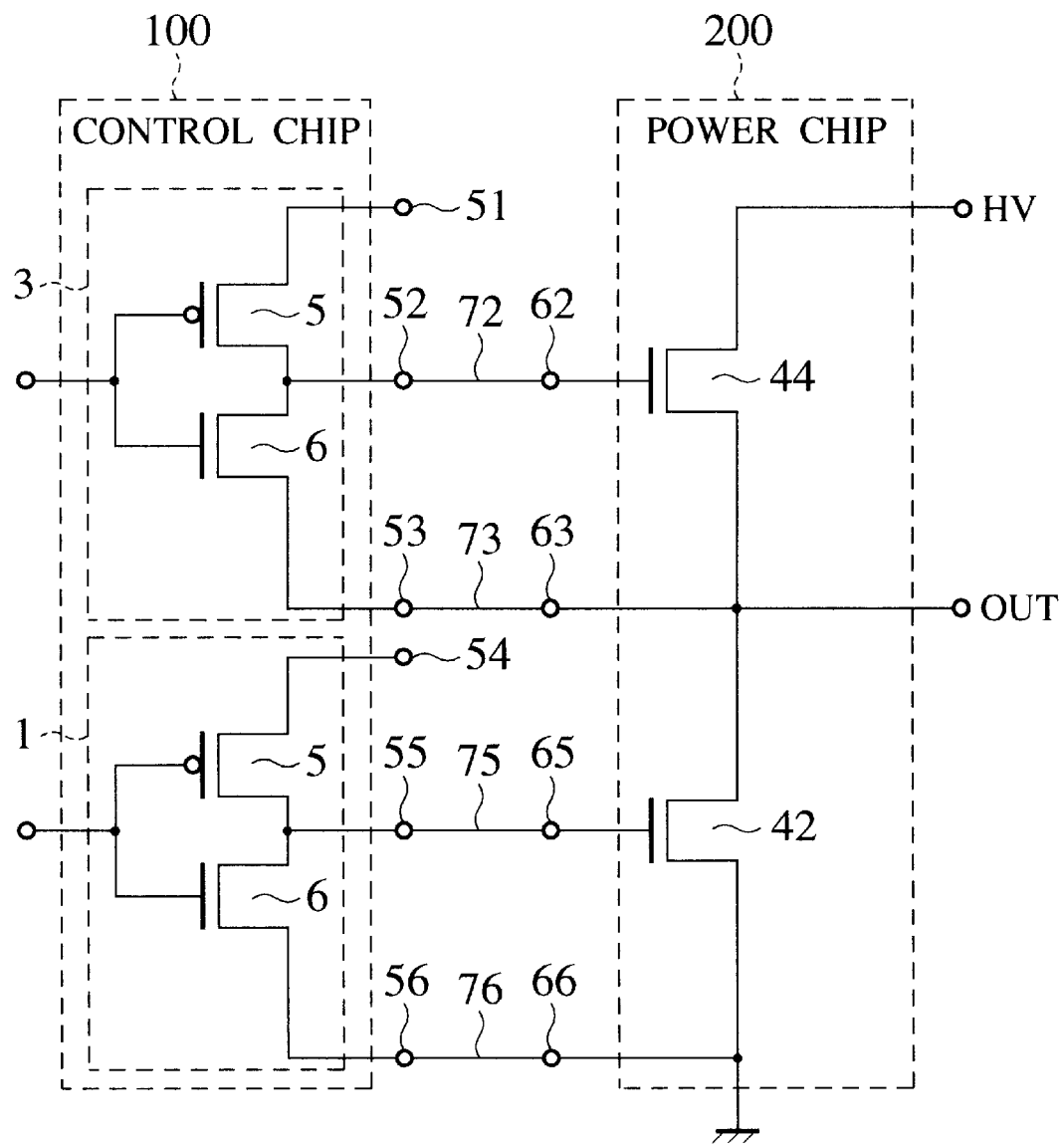
FIG. 12A is a diagram of the equivalent circuit of a hybrid IC related to the seventh embodiment of the present invention.

FIG. 12A is a circuit diagram of the hybrid IC related to the seventh embodiment of the present invention, in which a high breakdown voltage power element chip 200 and a control circuit chip 100 are merged on a prescribed substrate. The high breakdown voltage power element chip 200 comprises a high-side output DMOS transistor 44 which acts as the high-side output element and a low-side output DMOS transistor 42 which acts as the low-side output element. The high-side and low-side output DMOS transistors 44 and 42 may be formed independently on different semiconductor chips. The control circuit chip 100 comprises separately a high-side control circuit 3 and a low-side control circuit 1. Each of the high-side and low-side control circuits 3 and 1 is a CMOS circuit consisting of a p-MOS unit transistor 5 and an n-MOS unit transistor 6. The control circuit chip 100 is provided with terminals 51 through 56 and the high breakdown voltage power element chip 200, with terminals 62 through 66. The terminals 52 and 53 are connected via external wirings 72 and 73 to the terminals 62 and 63, respectively. The terminals 55 and 56 are connected via external wirings 75 and 76 to the terminals 65 and 66, respectively.

Figure 12B:
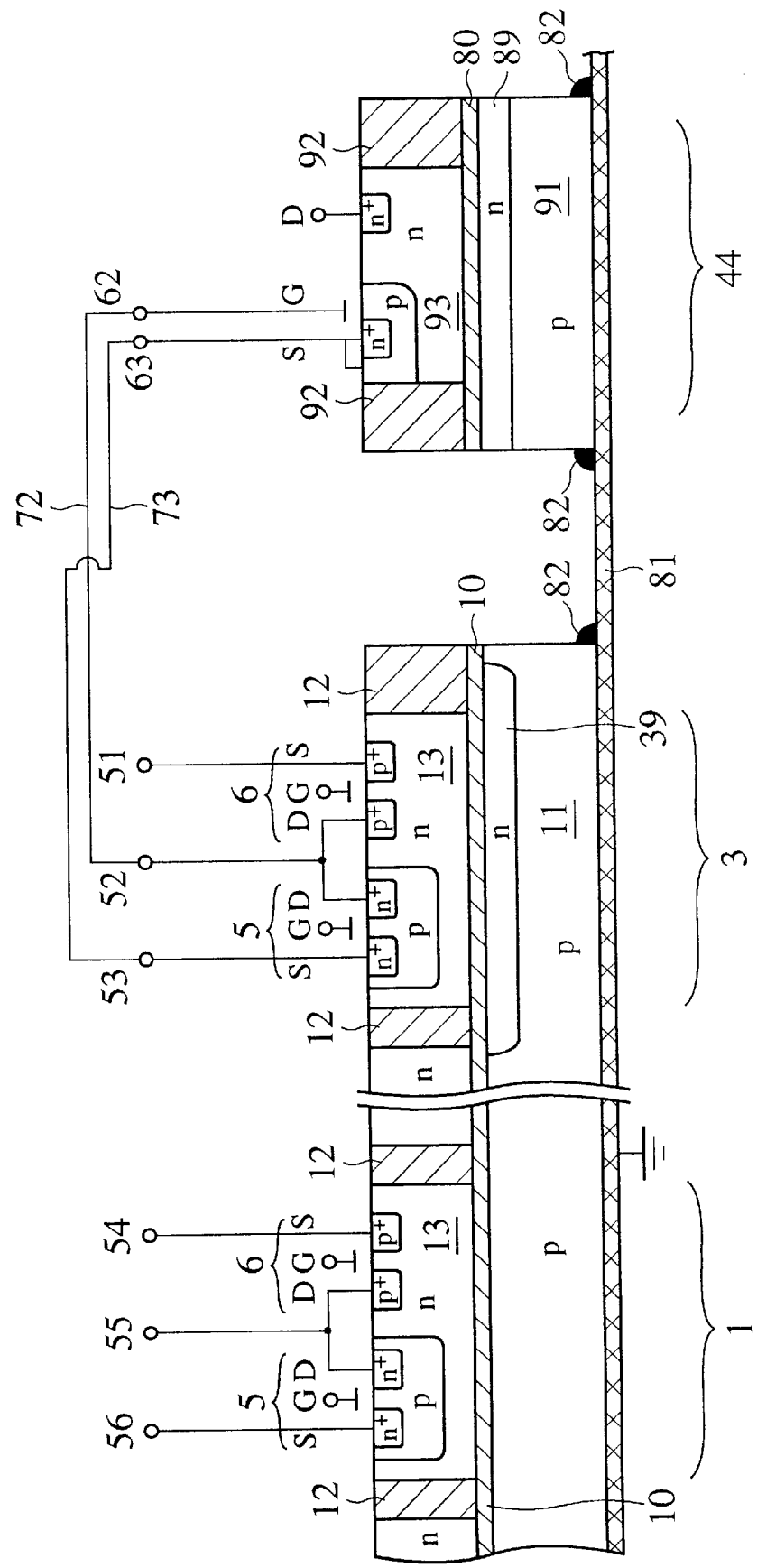
FIG. 12B is a schematic cross-sectional view illustrating part of a hybrid IC structure related to the seventh embodiment of the present invention.

FIG. 12B is a schematic cross-sectional view of the hybrid IC related to the seventh embodiment of the present invention, where the low-side output DMOS transistor 42 shown in FIG. 12A is omitted. On a conductive substrate 81, the control circuit chip 100 and the high breakdown voltage power element chip 200 are fixed with a bonding material 82. The conductive substrate 81 is biased to the ground. In place of this conductive substrate 81, a non-conductive substrate mounted, on itself, with a metal wiring layer may be used.

The control circuit chip 100 has an SOI structure in which on a p-type silicon-made base substrate 11 which acts as a first semiconductor region is formed an insulator film 10, i.e. SOI oxide film, on which is formed an n-type silicon layers 13 which acts as a second semiconductor region. The n-type silicon layer 13 is divided by element isolation regions 12 into a plurality of active layers 13. Each of the element isolation regions 12 comprises a groove and a high-resistivity material (dielectrics) buried in the groove. The groove starts at the top surface of the second semiconductor region and penetrates through the second semiconductor region 13 and then reaches the insulator film. The high-resistivity material buried in the groove may be an oxide film or a high-resistivity polycrystalline silicon film, etc. In one of the active layers 13 is formed a CMOS circuit which acts as the high-side control circuit 3 and in another active layer, another CMOS circuit which acts as the low-side control circuit 1. Below a particular active layer 13 in which the high-side control circuit 3 is formed, an n-type diffused layer 39 which acts as a third semiconductor region is formed. The n-type diffused layer 39 is provided at the top surface of the p-type silicon layer 11 in the vicinity of the boundary between the p-type silicon layer 11 and the insulator film 10, i.e. SOI oxide film. The n-type diffused layer 39 thoroughly covers area corresponding just under the whole bottom surface of the particular active layer 13 in which the high-side control circuit 3 is formed.

The high breakdown voltage power element chip 200 has an SOI structure comprising; a p-type silicon substrate 91; an SOI oxide film 80; and an n-type silicon layer 93, in which the high-side output DMOS transistor 44 is formed. Between the SOI oxide film 80 and the p-type silicon substrate 91 is provided an n-type diffused layer 89. The gate terminal 62 of the high-side output DMOS transistor 44 is connected with the output terminal 52 of the high-side control circuit 3 via an external wiring 72 such as a bonding wire. The source terminal 63 of an n$^+$-type source region of the high-side DMOS transistor is electrically connected via an external wiring 73 with the source terminals 53 of an n$^+$-type source region of the n-type MOS transistor 5 of the CMOS circuit.

In the structure shown in FIG. 12B, the capacitance of SOI oxide film $C_{OX}$ is connected in series with pn-junction capacitance $C_J$, so that the total capacitance C decreases as indicated by Equation (1). Therefore, even when high voltage is applied between the n-type silicon layer 13 and the p-type silicon layer 11, no p-type inversion layer will be generated at the bottom of the active layer 13. Likewise, no p-type inversion layer will be generated at the bottom of the n-type silicon layer 93. Thus, the generation of a leakage current and the latchup phenomenon are inhibited within the high-side control circuit 3, stabilizing the operations of the hybrid IC. At the same time, the effective drift region's thickness of the output DMOS transistor would not decrease, thus preventing the on-resistance RON of the output DMOS transistor from increasing. The structure of hybrid ICs according to the present invention fits large-current devices of the maximum current handling capability of several tens of Amperes to several hundreds of Amperes, realizing large-current handling capability hybrid ICs with a small conduction loss.

Figure 13:
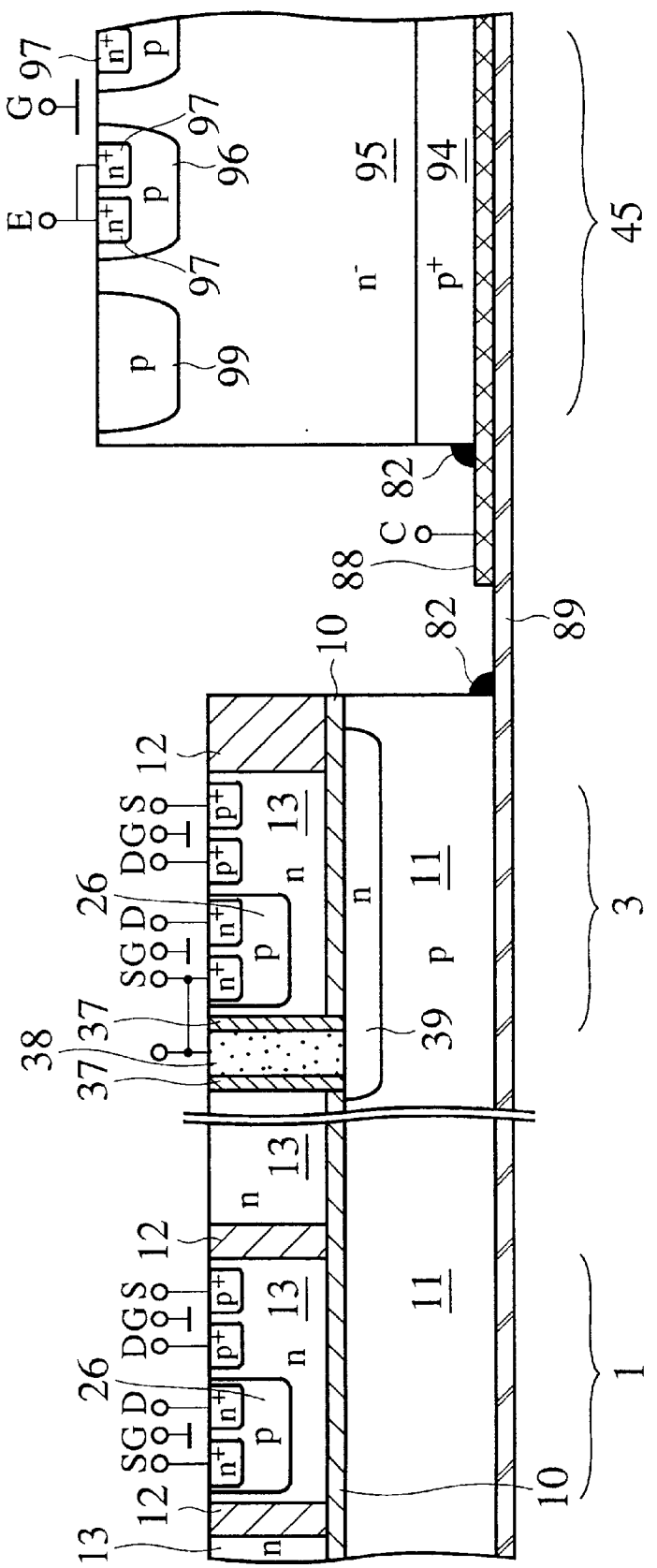
FIG. 13 is a schematic cross-sectional view of part of a hybrid IC structure related to one modification of the seventh embodiment of the present invention.

FIG. 13 is a schematic cross-sectional view of a modification of the hybrid IC related to the seventh embodiment of the present invention. In this modification, a control circuit chip 100 and high breakdown voltage power element chip 200 are merged on a non-conductive substrate 89. As the non-conductive substrate may be used an alumina-made ceramic one, glass-epoxy one, or non-conductive metal one. As the high breakdown voltage power element is used a vertical IGBT 45, which is fixed with a conductive bonding material or solder onto a metal wiring 88 such as coppermade film directly bonded onto the non-conductive substrate 89. The metal wiring 88 acts as the collector terminal of the vertical IGBT 45.

The structure of the control circuit chip 100 of the modification shown in FIG. 13 is the same as that shown in FIG. 12B, except that a groove and a high-conductivity region 38 burying the groove are provided. The groove starts at the top surface of an active layer 13 which acts as a second semiconductor region and penetrates through the active layer 13 and an insulator film 10 and then reaches a third semiconductor region 39. Inside this groove is embedded the high-conductivity region 38. This high-conductivity region 38 is connected, via a surface wiring made of Al or doped polycrystalline silicon, with an $n^+$-type source region of an n-MOS transistor element of a CMOS circuit 3 which acts as the high-side control circuit. Therefore, it is possible to equalize the reference potential, i.e. potential of the $n^+$-type source region, of the high-side control circuit to the potential of the third semiconductor region 39, thus ever effecting the inhibition of inversion layers. As the high-conductivity region 38 may be used a refractory-metal silicide such as $WSi_2$, $MoSi_2$, or $TiSi_2$ respectively made of W, Mo, or Ti or doped polycrystalline silicon. The side wall of the high-conductivity region 38 may be encapsulated by a side wall oxide film 37. Namely, the high-conductivity region 38 may be deposited on the side wall oxide film 37, after an insulator film 37, which acts as the side wall oxide film, is formed on the side wall of the groove.

The vertical IGBT in this modification mainly comprises an $n^-$-type drift region 95 formed on a $p^+$-type collector region 94; a p-type base region 96 formed at the top surface of this drift region 95; and an $n^+$-type emitter region 97 formed in this base region 96. The high breakdown voltage power element chip 200 is surrounded by a p-type guard ring 99. Including the high breakdown voltage power element chip 200, only part of which is shown in FIG. 13 though, actually a plurality of IGBT unit elements are arranged to enable the current handling capability of several tens of Amperes to 1000 Amperes. In place of the vertical IGBT in FIG. 13, a lateral IGBT or LDMOS transistor having an SOI structure may be used. When the SOI structure is employed, it is preferable to provide, between an SOI oxide film and a base substrate, a semiconductor region having such a conductivity type as being opposite to that of the base substrate. And it is also preferable to short-circuit, as in the control circuit chip 100, this semiconductor region having the opposite conductivity type to one of the two main electrodes of the high breakdown voltage power element, by use of the groove and the buried high-conductivity regions. Also, in place of the vertical IGBT shown in FIG. 13 may of course be used an Injection Enhanced Gate Transistor (IEGT), a vertical DMOS transistor, vertical UMOS transistor, Gate Turn-Off (GTO) thyristor, or Static Induction (SI) thyristor. The modification of the seventh embodiment of the present invention shown in FIG. 13 can realize large maximum controllable current devices having blocking voltages of 800V to 4500V. Since the third semiconductor region 39 in the control circuit chip 100 has the same reference potential as the high-side control circuit 3, i.e. potential of the $n^+$-type source region, no leakage current would flow in the control circuit, to realize stable and high-reliability hybrid ICs even in the case where 1700V or higher ratings of power elements are operated.

Figure 14:
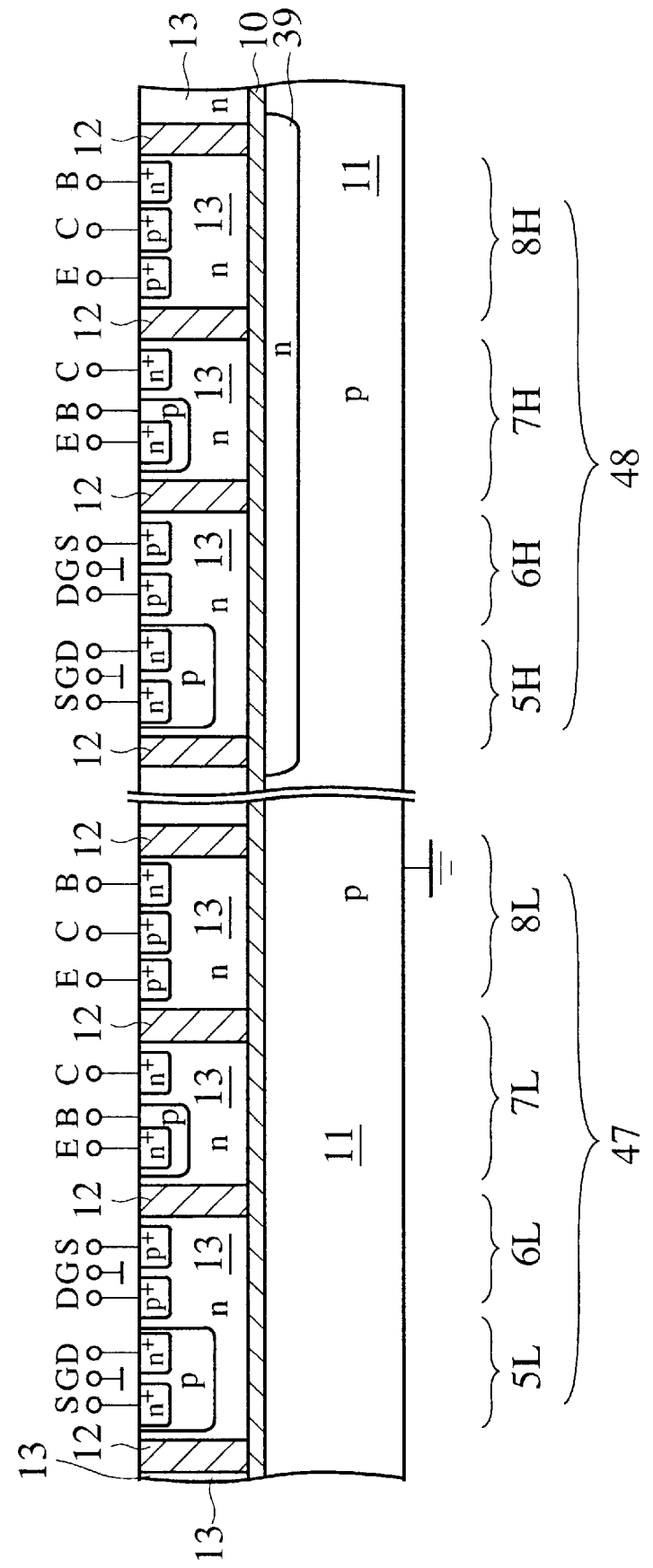
FIG. 14 is a schematic cross-sectional view of a control circuit chip of a hybrid IC related to another modification of the seventh embodiment of the present invention.
Figure 15:
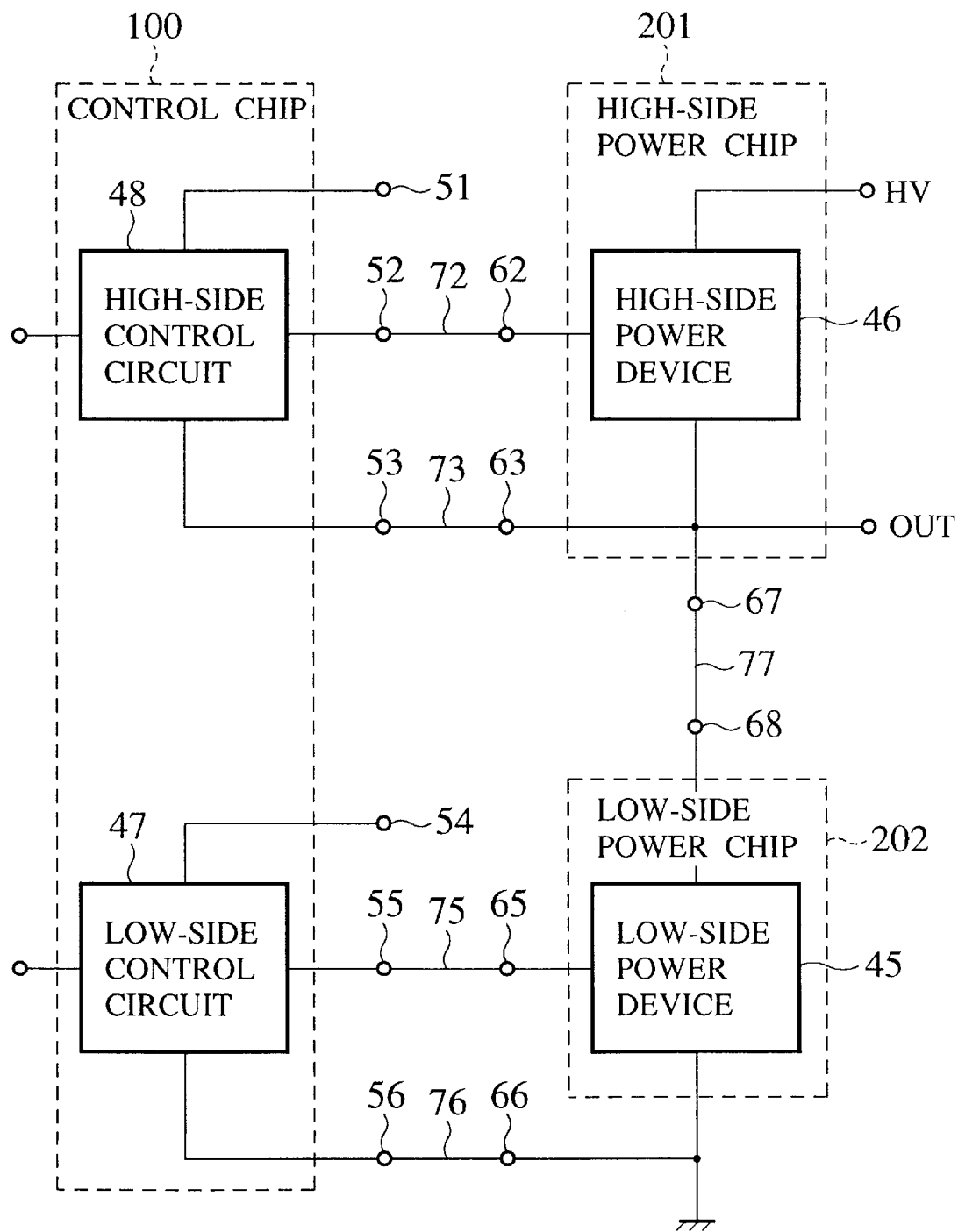
FIG. 15 is a diagram of the more general equivalent circuit related to the seventh embodiment of the present invention.

The control circuit chip according to the seventh embodiment of the present invention may be made, other than the CMOS transistors such as shown in FIG. 14, of BiCMOS configuration such as shown in FIG. 14, or n-MOS transistors, bipolar transistors, or Static Induction Transistors (SITs). In this case, it is preferable to provide the third semiconductor region just under the whole bottom surface of n-type active layers integrating the high-side control circuit 48. FIG. 15 shows the diagram of a more general equivalent circuit of the seventh embodiment of the present invention. Any structure represented by the equivalent circuit shown in FIG. 15 such as a hybrid IC or the equivalent power device comprising, at least a high-side power element chip 201, a low-side power element chip 202, and a control circuit chip 100 would increase the degree of freedom in design, thereby realizing a variety of large current handling capability devices with high blocking capability having largely improved reliabilities.

Various modifications will become possible for those skilled in the art after receiving the teachings of the present disclosure without departing from the scope thereof.

What is claimed is:

1. A power IC having high-side and low-side circuits connected in series, a connection point between the high-side and low-side circuits oscillating between predetermined voltage levels, the high-side circuit having a high-side power element and a high-side control circuit for providing a high-side control signal to the high-side power element, the low-side circuit having a low-side power element and a low-side control circuit for providing a low-side control signal independent from the high-side control signal to the low-side power element, higher voltage being applied to the high-side power element than that applied to the low-side power element the power IC comprising:

a first semiconductor region which acts as a base substrate;

an insulator film formed on the first semiconductor region;

a second semiconductor region formed on top of the insulator film so as to form a SOI structure with said first semiconductor region and insulator flim, the SOI structure serving as a first capacitor;

element isolation regions devising said second semiconductor region into dielectrically isolated first, second, third, and fourth active layers, so as to form said high-side power element, high-side control circuit, low-side power element, and low-side control circuit therein, respectively;

a third semiconductor region having a conductivity type opposite to that of the first semiconductor region, selectively disposed in vicinity of a boundary between the first semiconductor region and the insulator film, and disposed at a top surfaces of the first semiconductor region, the third semiconductor region having a specific impurity concentration and diffusion depth so as to develop a large width depletion layer between said third and first semiconductor regions such that a second capacitor being connected between said third and first semiconductor regions, the second capacitor being connected to said first capacitor so that the second capacitor suppresses generations of inversion layers, which tend to be formed at bottoms of said first and second active layers at floating potentials, the bottoms being contacted with the insulator film, said first capacitor being connected between said third and second semiconductor regions;

a groove which starts at a top surface of said first active layer, penetrates through said first active layer and said insulator film, and reaches said third semiconductor region;

a high-conductivity region formed inside the groove;

a fourth semiconductor region formed in a part of a top surface of said first active layer, the fourth semiconductor region being connected to said connection point; and a surface wiring configured to connect said high-conductivity region with said fourth semiconductor region.

2. The power IC of claim 1, wherein said first and second semiconductor regions are opposite to each other in conductivity type.

3. The power IC of claim 1, wherein said first and second semiconductor regions have the same conductivity type.

4. The power IC of claim 1, wherein said third semiconductor region is formed throughout on the top surface of said first semiconductor region.

5. The power IC of claim 2, wherein said third semiconductor region is formed just under a whole bottom surface of one of said first, second, third and fourth active layers.

6. The power IC of claim 1, further comprising a fifth semiconductor region formed between said fourth semiconductor region and said first active layer.

7. The power IC of claim 1, wherein said fourth semiconductor region is one of two main electrodes of a high-blocking voltage power element which acts as said high-side power element.

8. The power IC of claim 7, wherein said high-blocking voltage power element is a Lateral Double-diffused MOSFET (LDMOSFET).

9. The power IC of claim 8, wherein said one of the two main electrodes is a source region.

10. The power IC of claim 7, wherein said high-blocking voltage power element is an Insulated Gate Bipolar Transistor (IGBT).

11. The power IC of claim 10, wherein said one of the two main electrodes is an emitter region.

12. The power IC of claim 1, wherein said third semiconductor region are divided into mutually independent regions, each independent region is arranged throughout under the first active layer and the second active layer, respectively.

13. The power IC of claim 1, wherein said third semiconductor region is formed as a common region throughout below the first and second active layers.

14. The power IC of claim 1, wherein said third semiconductor region is selectively formed only below said high-side circuit.

15. A power device having high-side and low-side circuits connected in series, a connection point between said high-side and low-side circuits oscillating between predetermined voltage levels, the high-side circuit having a high-side power element and a high-side control circuit for providing a high-side control signal to the high-side power element, the low-side circuit having a low-side power element and a low-side control circuit for providing a low-side control signal independent from the high-side control signal to the low-side power element, higher voltage being applied to the high-side power element than that applied to the low-side power element, the power device comprising:

(a) a first semiconductor chip having the high-side and low side control circuits are merged in, comprising:

a first semiconductor region which acts as a base substrate;

an insulator film formed on top of the first semiconductor region;

a second semiconductor region formed on top of the insulator film so as to form a SOI structure with said first semiconductor region and insulator film, the SOI structure serving as a first capacitor;

element isolation regions dividing said second semiconductor region into dielectrically isolated high-side and low-side active layers, so as to form said high-side control circuit and low-side control circuit therein respectively:

a third semiconductor region, having a conductivity type opposite to that of said first semiconductor region formed in vicinity of a boundary between the first semiconductor region and the insulator film and in a top surface of the first semiconductor region, the third semiconductor region having a specific impurity concentration and diffusion depth so as to develop a large width depletion layer between said third and first semiconductor regions such that a second capacitor being connected between said third and first semiconductor regions, the second capacitor being connected to said first capacitor so that the second capacitor suppresses generation of an inversion layer, which tends to be formed at a bottom of said high-side active layer, said first capacitor being connected between said third and second semiconductor regions;

a groove which starts at a top surface of said high-side active layer and penetrates through said high-side active layer and said insulator film and reaches said third semiconductor region;

a high-conductivity region buried inside the groove, a fourth semiconductor region formed in a part of a top surface of said high-side active layer, the fourth semiconductor region being connected to said connection point; and a surface wiring configured to connect said high-conductivity region with said fourth semiconductor region, and (b) a second semiconductor chip for merging the high-side power element.

16. The power device of claim 15, wherein said high-side control circuit and said high-side output element are formed on different semiconductor chips.

* * * * *

UNITED STATES PATENT AND TRADEMARK OFFICE
CERTIFICATE OF CORRECTION

PATENT NO. : 6,130,458
DATED : October 10, 2000
INVENTOR(S): Yosuke TAKAGI, et al.

It is certified that an error appears in the above-identified patent and that said Letters Patent is hereby corrected as shown below:

On the Title page, the CPA information has been omitted. It should read as follows:

--- [45] Date of Patent: *Oct. 10, 2000 ---

--- [*] Notice: This patent issued on a continued prosecution application filed under 37 CFR 1.53(d), and is subject to the twenty year patent term provisions of 35 U.S.C. 154(a)(2). ---

Signed and Sealed this

Twenty-second Day of May, 2001

Attest:

NICHOLAS P. GODICI

Attesting Officer     Acting Director of the United States Patent and Trademark Office